United States Patent
Shimada

(10) Patent No.: US 12,302,600 B2
(45) Date of Patent: May 13, 2025

(54) SEMICONDUCTOR DEVICE HAVING SEMICONDUCTOR COLUMN PORTIONS

(71) Applicant: SEIKO EPSON CORPORATION, Tokyo (JP)

(72) Inventor: Hiroyuki Shimada, Chuo (JP)

(73) Assignee: SEIKO EPSON CORPORATION, Tokyo (JP)

(*) Notice: Subject to any disclaimer, the term of this patent is extended or adjusted under 35 U.S.C. 154(b) by 365 days.

(21) Appl. No.: 17/868,806

(22) Filed: Jul. 20, 2022

(65) Prior Publication Data

US 2023/0028402 A1 Jan. 26, 2023

(30) Foreign Application Priority Data

Jul. 21, 2021 (JP) ................. 2021-121035

(51) Int. Cl.
| | |
|---|---|
| H01L 21/70 | (2006.01) |
| H10D 30/63 | (2025.01) |
| H10D 30/67 | (2025.01) |
| H10D 62/10 | (2025.01) |
| H10D 64/20 | (2025.01) |
| H10D 64/23 | (2025.01) |

(52) U.S. Cl.
CPC ......... *H10D 30/63* (2025.01); *H10D 30/6735* (2025.01); *H10D 62/119* (2025.01); *H10D 64/205* (2025.01); *H10D 64/252* (2025.01)

(58) Field of Classification Search
CPC ............. H01L 29/0673; H01L 29/0676; H01L 29/42392; H01L 29/66666; H01L 29/7827; H01L 29/7828; H01L 29/78696
See application file for complete search history.

(56) References Cited

U.S. PATENT DOCUMENTS 9,721,845 B1 * 8/2017 Cheng ............... H01L 29/42392
9,768,085 B1 * 9/2017 Cheng ............... H01L 29/66795
(Continued)

FOREIGN PATENT DOCUMENTS

| JP | 2008226914 | 9/2008 |
|---|---|---|
| JP | 2011129775 | 6/2011 |

(Continued)

OTHER PUBLICATIONS

F. Yu et al., Vertical architecture for enhancement mode power transistors based on GaN nanowires, Appl. Phys. Lett. 108, 213503 (2016); https://doi.org/10.1063/1.4952715, Published Online: May 27, 2016, pp. 1-6.

(Continued)

*Primary Examiner* — Eric A. Ward
(74) *Attorney, Agent, or Firm* — JCIPRNET

(57) ABSTRACT

A semiconductor device includes a plurality of column portions made of a semiconductor. The plurality of column portions each include a source region, a drain region, and a channel formation region including a channel formed between the source region and the drain region. The semiconductor device further includes: a gate electrode provided at a side wall of the channel formation region with an insulating layer being interposed between the gate electrode and the side wall; a first semiconductor layer coupled to either one of the source region and the drain region of each of the plurality of column portions; and a first metal layer coupled to the first semiconductor layer.

6 Claims, 20 Drawing Sheets

(56) References Cited

U.S. PATENT DOCUMENTS

| | | | |
|---|---|---|---|
| 2004/0232480 A1* | 11/2004 | Ohta | H01L 29/66742 |
| | | | 257/E27.081 |
| 2013/0113028 A2 | 5/2013 | Miyamoto et al. | |
| 2013/0240983 A1 | 9/2013 | Larrieu | |
| 2015/0380540 A1* | 12/2015 | Vellianitis | H01L 29/66356 |
| | | | 438/269 |
| 2018/0261685 A1* | 9/2018 | Mochizuki | H01L 29/66742 |
| 2018/0277446 A1* | 9/2018 | Gluschenkov | H10D 30/63 |
| 2019/0198667 A1* | 6/2019 | Liu | H01L 29/78 |

FOREIGN PATENT DOCUMENTS

| | | |
|---|---|---|
| JP | 2014503998 | 2/2014 |
| JP | 6035245 | 11/2016 |
| WO | 2011024549 | 3/2011 |

OTHER PUBLICATIONS

Ming Xiao et al., Design and Simulation of GaN Superjunction Transistors With 2-DEG Channels and Fin Channels, IEEE Journal of Emerging and Selected Topics in Power Electronics, vol. 7, No. 3, Sep. 2019, published on Apr. 24, 2019, pp. 1-10.

* cited by examiner

SEMICONDUCTOR DEVICE HAVING SEMICONDUCTOR COLUMN PORTIONS

The present application is based on, and claims priority from JP Application Serial Number 2021-121035, filed on Jul. 21, 2021, the disclosure of which is hereby incorporated by reference herein in its entirety.

BACKGROUND

1. Technical Field

The present disclosure relates to a semiconductor device.

2. Related Art

As the structure of a next-generation nano-device, semiconductor thin wires having a thickness of the order of nanometers (nm) have been attracting attention in terms of applications to various types of semiconductor devices such as a transistor or light source. In addition, in a case of employing a Gate-All-Around (GAA) structure in which the entire circumferential direction is surrounded by a semiconductor thin-wire gate electrode, a portion surrounded by the gate electrode is fully depleted. This improves an electric-current controllability to achieve a property in which ON and OFF are switched rapidly in terms of time. That is, by employing the GAA structure, it is possible to achieve both the favorable ON-OFF switch property and the miniaturization. This makes it possible to suppress an increase in the power consumption or heat generated in the semiconductor device, which leads to an improvement in the performance.

For example, JP-T-2014-503998 discloses a method of manufacturing a field effect transistor (FET, semiconductor device) including a plurality of elementary transistors and implemented at a semiconductor column portion provided in a network manner. In the case of the FET disclosed in JP-T-2014-503998, the vertical semiconductor column portion may be formed at the substrate in a so-called bottom-up manner or may be formed in a so-called top-down manner. When the semiconductor column portion is formed in the bottom-up manner, a material of the semiconductor column portion is caused to grow in a region of the substrate where the column portion is formed. When the semiconductor column is formed in the top-down manner, a material of the semiconductor column portion is formed at substantially the entire region of the substrate where the column portion is formed, and then, the material located at a portion other than the region where the column portion is formed is removed through etching.

The FET disclosed in JP-T-2014-503998 is configured such that at least an electrode at the upper side, that is, an electrode at the drain region side that is common to the plurality of semiconductor column portions is made of a conductive material such as a metal. When the FET is formed in the top-down manner, the conductive layer made of a conductive material is masked to perform etching. Thus, the area of the conductive layer and the area of ohmic contact between the semiconductor column portion and the conductive layer are reduced to be substantially equal to the area of the column portion. This may increase the contact resistance at a connection portion between the electrode and the semiconductor column portion having a reduced diameter, which leads to a deterioration in the performance of the semiconductor device.

SUMMARY

In order to solve the problem described above, a semiconductor device according to one aspect of the present disclosure includes a plurality of column portions including a semiconductor, the plurality of column portions each including a source region, a drain region, and a channel formation region located between the source region and the drain region, and the semiconductor device further includes a gate electrode provided, via an insulating layer, at a side wall of the channel formation region of each of the plurality of column portions and configured to control a current between the source region and the drain region, a first semiconductor layer coupled to the source region of each of the plurality of column portions, a first metal layer coupled to the first semiconductor layer, a second semiconductor layer coupled to the drain region of each of the plurality of column portions, and a second metal layer coupled to the second semiconductor layer.

DESCRIPTION OF EXEMPLARY EMBODIMENTS

First Embodiment

Below, a first embodiment according to the present disclosure will be described with reference to FIGS. 1 to 14.

In each of the drawings below, the scale of the dimension may be changed depending on the constituent elements in order to facilitate viewing the independent constituent elements.

Basic Structure of Semiconductor Device

Figure 1:
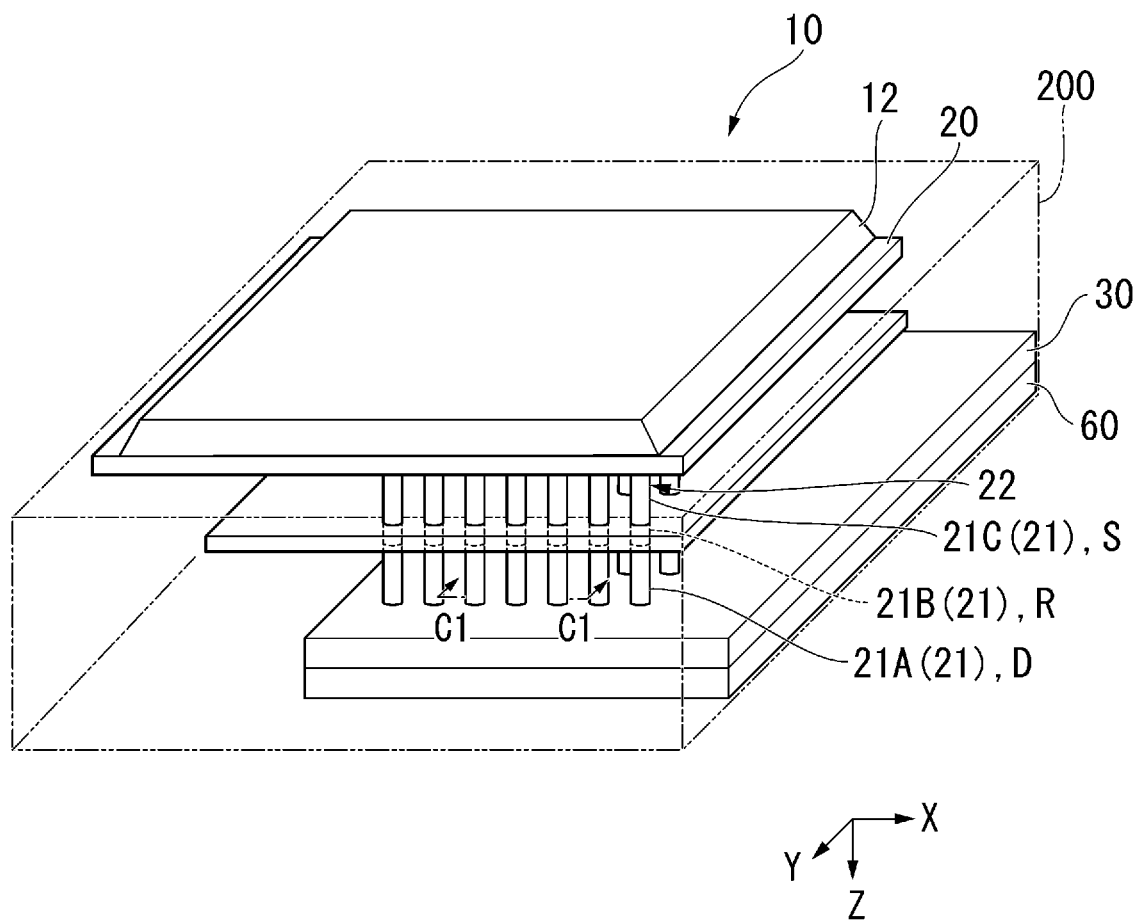
FIG. 1 is a perspective view illustrating a semiconductor device according to a first embodiment.

FIG. 1 is a perspective view illustrating a semiconductor device according to a first embodiment. As illustrated in FIG. 1, a semiconductor device 10 according to the first embodiment is, for example, an FET, and is a so-called power device. The semiconductor device 10 mainly includes a metal layer (second metal layer) 12; a semiconductor layer (second semiconductor layer) 20 and a semiconductor layer (semiconductor) 21C, each of which constitutes a source region S of an FET; a semiconductor layer (semiconductor) 21A and a semiconductor layer (first semiconductor layer) 30, each of which constitutes a drain region D of the FET; a semiconductor layer (semiconductor) 21B that constitutes a drift region (channel formation region) R of the FET; a gate insulating film (insulating layer) 40; a gate electrode 50; and a metal layer (first metal layer) 60 that constitutes a contact region of the FET. In FIG. 1, the gate insulating film 40 is interposed between the semiconductor layer 21B and the gate electrode 50, but is not illustrated in FIG. 1.

Below, the Z direction is a direction parallel to a thickness direction of the metal layer 12 and directed from the back surface 12b of the metal layer 12 toward the front surface 12a. The X direction and the Y direction are two directions each parallel to the front surface 12a of the metal layer 12 and perpendicular to each other. The Z direction is perpendicular to the X direction and the Y direction.

In addition to the configuration described above, the semiconductor device 10 may include, for example, a gate conductive layer coupled directly to the gate electrode 50 in the Z direction, and a gate metal layer provided at an opposite side of the gate conductive layer from the gate electrode 50 side, although illustration is not given. In addition, the semiconductor device 10 may include, for example, a source conductive layer coupled directly to the semiconductor layer 20 in the Z direction, and a source metal layer provided at an opposite side of the source conductive layer from the semiconductor layer 20 side. Alternatively, a wire bonding may be provided at the gate electrode 50, and a wire bonding may be provided at the metal layer 12. The gate conductive layer and the source conductive layer function as a contact plug. The gate metal layer functions as a contact terminal to the gate electrode 50, and the source metal layer functions as a contact terminal to the source region S of the FET. Each of the gate conductive layer and the source conductive layer is made, for example, of tungsten (W). Each of the gate metal layer and the source metal layer is made, for example, of a metal such as copper (Cu) or aluminum (Al). When the wire bonding is provided at the gate electrode 50 and the wire bonding is provided at the metal layer 12, each of the wire bondings may be made of a metal such as copper (Cu) or aluminum (Al).

Figure 2:
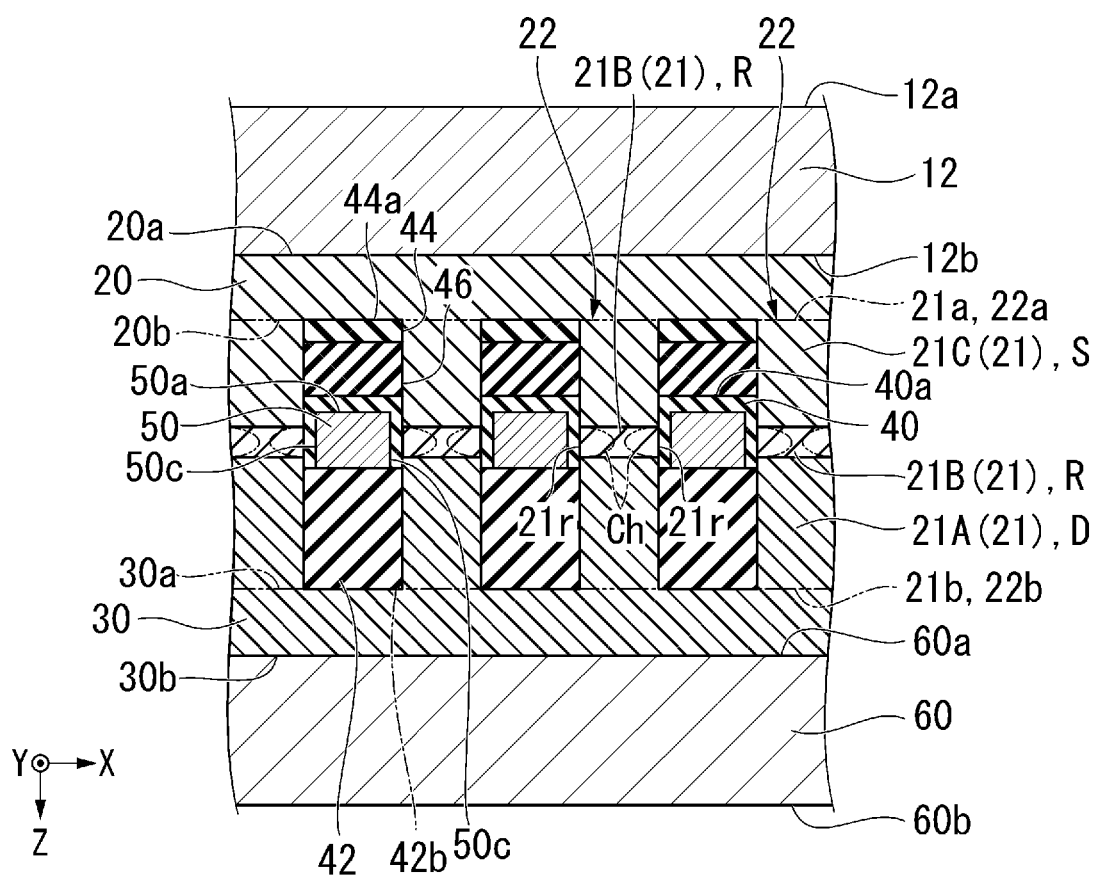
FIG. 2 is a cross-sectional view illustrating the semiconductor device in FIG. 1 as viewed toward the arrow of the line C1-C1 in FIG. 1.

FIG. 2 is a cross-sectional view illustrating the semiconductor device 10 as viewed toward the arrow of the line C1-C1 in FIG. 1. As illustrated in FIGS. 1 and 2, the metal layer 60 functions as a base member configured to support the main members of the semiconductor device 10. In addition, the metal layer 60 extends along the X-Y plane and has a predetermined thickness. When having a constant thickness, a metal layer has a strength higher than a semiconductor layer. Thus, the predetermined thickness may be thinner than that of a semiconductor substrate used in a typical semiconductor device. A front surface 60a and a back surface 60b of the metal layer 60 are flat surfaces substantially parallel to the X-Y plane. The metal layer 60 is made, for example, of a metal such as Cu.

The semiconductor layer 30 is stacked on the back of the front surface 60a of the metal layer 60 in the Z direction. In addition, the semiconductor layer 30 extends along the X-Y plane and has a predetermined thickness. A front surface 30a and a bottom surface 30b of the semiconductor layer 30 are flat surfaces substantially parallel to the X-Y plane. The semiconductor layer 30 is made, for example, of an n-type semiconductor. The n-type semiconductor is, for example, gallium nitride (GaN) doped with an n-type impurity. The n-type impurity includes, for example, silicon (Si) or the like. GaN is able to convert electrical power more efficiently than that of other semiconductors, and is also able to output, per volume, relatively high electrical power. For example, the band gap of GaN is approximately three times greater than that of Si commonly used in a typical power device. The dielectric breakdown field of GaN is an order of magnitude larger than that of Si, and hence, on-resistance is about three orders of magnitude lower than the performance limitation due to Si. The saturation electron velocity of GaN is greater than that of Si or the like, and hence, the operation of the semiconductor device 10 is made faster.

The semiconductor layer 21A, the semiconductor layer 21B, and the semiconductor layer 21C are stacked sequentially in the Z direction, and have the same shape and the same size within the X-Y plane. In addition, the semiconductor layer 21A, the semiconductor layer 21B, and the semiconductor layer 21C constitute one column portion (column portion) 22. The semiconductor device 10 includes a plurality of column portions 22. The plurality of column portions 22 are arranged at predetermined intervals along the X direction and the Y direction. Each of the plurality of column portions 22 protrudes in the Z direction from a predetermined region of the front surface 20a of the semiconductor layer 20 that constitutes the source region S. The cross section of each of the plurality of column portions 22 that intersects the X-Y plane has a circular shape, for example. The structure of the FET is achieved with the plurality of column portions 22, and GaN is used. This achieves a reduction in the on-resistance per area of the semiconductor device 10. The reduction in the on-resistance per area makes it possible to reduce the area and reduce the parasitic capacitor existing in the FET. This makes it possible to increase the switching frequency at the time of switching the semiconductor device 10. Thus, the power density of the semiconductor device 10 as a power supply improves.

The maximum size of each of the plurality of column portions 22 within the X-Y plane is, for example, approximately 0.3 µm, and is at least equal to or less than 0.5 µm. By setting the plurality of column portions 22 to have a small diameter as described above, the region Ch where a channel is formed easily reaches the substantial center portion of the semiconductor layer 21C within the X-Y plane, which makes it possible to achieve full depletion.

Note that the term "semiconductor" in Claims collectively represents the semiconductor 21 that constitutes the column portion 22. This does not mean that all the semiconductor layers 21A, 21B, and 21C are made of the same type of semiconductor, and does include semiconductors having impurity concentrations differing from each other while satisfying conditions or the like that will be described later.

The semiconductor layer 21A is disposed at the lowermost layer of the column portion 22, and constitutes the drain region D together with the semiconductor layer 30. A bottom surface 22b of each of the plurality of column portions 22 is in contact with the front surface 30a of the semiconductor layer 30. With the arrangement described above, the semiconductor layer 30 is coupled to the semiconductor layer 21A (the drain region D, the other one of the source region and the drain region) of each of the plurality of column portions 22. In the first embodiment, the semiconductor layer 21A is made of an n-type semiconductor, and is made, for example, of the same semiconductor as the semiconductor layer 30. The n-type semiconductor is GaN doped, for example, with an n-type impurity such as Si as described above. Below, GaN doped with the n-type impurity may be referred to as n-GaN. In addition, although illustration is not given, the semiconductor layer 21A includes a first region, and a second region having an impurity concentration lower than the first region, and the second region may be disposed between the first region and the semiconductor layer 21B. In this case, the impurity concentration of the second region is lower than the first region and is greater than the semiconductor layer 21B. The second region is a drift region.

The semiconductor layer 21B is disposed at an intermediate layer disposed between the semiconductor layers 21A and 21C of the column portion 22 in the Z direction, and constitutes the channel formation region R. The channel formation region R is formed between the source region S and the drain region D. In addition, the channel formation region R includes the region Ch where a channel is formed, and is a region where a gradient is formed due to a difference in the impurity concentration of the semiconductors 21 that constitute the semiconductor layers 21A and 21C, and the drift velocity of electric charge is increased by receiving the gate voltage. The size of the semiconductor layer 21B in the Z direction is smaller than the size of each of the semiconductor layers 21A and 21C in the Z direction.

The semiconductor layer 21B is made, for example, of a semiconductor not doped with an impurity. The semiconductor not doped with an impurity is, for example, GaN. Hereinafter, the GaN not doped with an impurity may be referred to as u-GaN (undoped-GaN). Note that it is only necessary that the semiconductor layer 21B is made of a semiconductor having an impurity concentration lower than the n-type semiconductor that constitutes the semiconductor layer 21A, and is not necessarily limited to the semiconductor not doped with an impurity. However, as the impurity concentration of the semiconductor layer 21B gets closer to the impurity concentration of the semiconductor layer 21A, the on-resistance reduces, and the withstand voltage also reduces. This means that the on-resistance and the withstand voltage are in a trade-off relationship. The impurity concentration of the semiconductor layer 21B is appropriately set in consideration of the trade-off relationship with the impurity concentration of the semiconductor layer 21A and the magnitude of the semiconductor layer 21A in the Z direction. Note that, in order to facilitate manufacturing the semiconductor device 10, it is preferable that the same type of semiconductor is used to form the semiconductor layers 21A, 21B, and 21C, and the semiconductor is, for example, GaN in the first embodiment.

The semiconductor layer 21C is disposed at the uppermost layer of the column portion 22 and constitutes the source region S. The size of the semiconductor layer 21C in the Z direction is greater than at least the size of the semiconductor layer 21B in the Z direction, and is smaller than the size of the semiconductor layer 21A in the Z direction. The semiconductor layer 21C is made, for example, of an n-type semiconductor. The n-type semiconductor is GaN doped, for example, with an n-type impurity such as Si as described above.

The impurity concentration of the n-type semiconductor that constitutes the semiconductor layer 21C is at least higher than the impurity concentration of the semiconductor that constitutes the semiconductor layer 21B and is higher than the impurity concentration of the semiconductor that constitutes the semiconductor layer 21A. Hereinafter, of the n-GaN, n-GaN having a relatively high impurity concentration is also referred to as $n^+$-GaN, and n-GaN having a relatively low impurity concentration is also referred to as $n^-$-GaN. The size of the semiconductor layer 21A in the Z direction is greater than the size of the semiconductor layer 21C and the impurity concentration of the semiconductor that constitutes the semiconductor layer 21A is lower than that of the semiconductor layer 21C. This secures a wide depletion layer of the FET and also secures the withstand voltage of the semiconductor device 10. In addition, the withstand voltage is secured, the size of the semiconductor layer 21B in the Z direction is reduced to be lower than that of the semiconductor layer 21A or 21C, and GaN is used as the semiconductor 21. This configuration favorably reduces the on-resistance of the semiconductor device 10. Both the impurity concentration of the first region and the impurity concentration of the second region of the semiconductor layer 21A are lower than the impurity concentration of the semiconductor layer 21C.

The semiconductor layer 20 constitutes the source region S together with the semiconductor layer 21C. The semiconductor layer 20 extends along the X-Y plane, and couples semiconductor layers 21C of the plurality of column portions 22 to each other along the X-Y plane. The bottom surface 20b of the semiconductor layer 20 is in contact with the front surfaces 22a of the plurality of column portions 22. With the arrangement described above, the semiconductor layer 30 is coupled to the semiconductor layer 21C (the source region S, the other one of the source region and the drain region) of each of the plurality of column portions 22. In the first embodiment, the semiconductor layer 20 is made of the same semiconductor as the semiconductor layers 30, 21A, 21B, and 21C, and is made, for example, of an n-type semiconductor. In other words, in the semiconductor device 10 according to the first embodiment, the semiconductor layers 20, 21C, and 30 are made of $n^+$-GaN, the semiconductor layer 21A is made of $n^-$-Gan, and the semiconductor layer 21B is made of u-GaN.

The metal layer 12 is stacked at the front surface 20a of the semiconductor layer 20 to form a contact region, and is coupled to the semiconductor layer 20. The metal layer 12 is disposed so as to be opposed to the metal layer 60 in the Z direction, and functions as a base member configured to support the main members of the semiconductor device 10. In addition, the metal layer 12 has a predetermined thickness. The front surface 12a and the back surface 12b of the metal layer 12 are flat surfaces substantially parallel to the X-Y plane. The metal layer 12 is made, for example, of a metal such as aluminum (Al) or Cu.

The gate electrode 50 is provided at least at a side wall 21r of the semiconductor layer 21B of the channel formation region R with the gate insulating film 40 being interposed between the gate electrode 50 and the side wall 21r. The size of the gate electrode 50 in the Z direction is greater than that of the semiconductor layer 21B. When viewed in the Z direction, the gate electrode 50 overlaps with the end portion, at the channel formation region R side, of the semiconductor layer 21A of the drain region D and an end portion, at the channel formation region R side, of the semiconductor layer 21C of the source region S. In plan view as viewed from the Z direction, the gate electrode 50 is provided so as to surround the periphery of each of the column portions 22. That is, in plan view as viewed from the Z direction, the gate electrode 50 is provided so as to surround the channel formation region R.

The gate electrode 50 includes, for example, a polycrystalline silicon (Poly-Si), and is made of Poly-Si doped with boron (B). Poly-Si doped with B has a high work function among materials that can constitute the gate electrode. As the sufficiently high work function is achieved, it is possible to achieve a positive threshold voltage (that is, Normally Off) of the semiconductor device 10.

The gate insulating film 40 is provided at a side wall 50c and a front surface 50a of the gate electrode 50. In other words, in the X-Y plane, the gate insulating film 40 is interposed between the gate electrode 50 and the semiconductor layer 21B. The gate insulating film 40 is made, for example, of silicon oxide ($SiO_2$).

An insulating layer 46 and a mask insulating film 44 are stacked sequentially at the front surface 40a of the gate insulating film 40 in the Z direction. A front surface 46a of the insulating layer 46 overlaps with the front surface 22a of each of the plurality of column portions 22 in the Z direction, and is formed so as to be substantially flush with a front surface 21a of the semiconductor layer 21C. The size of the insulating layer 46 in the Z direction is greater than that of the mask insulating film 44. The insulating layer 46 is comprised, for example, of glass including $SiO_2$ as a main component or is made of $SiO_2$ or the like. The mask insulating film 44 is made, for example, of $SiO_2$.

An insulating layer 42 is provided between the gate electrode 50 and the semiconductor layer 30 along the Z direction. A bottom surface 42b of the insulating layer 42 overlaps with the bottom surface 22b of each of the plurality of column portions 22 in the Z direction, and is formed so as to be flush with of a bottom surface 21b of the semiconductor layer 21A. Column portions 22 adjacent to each other in the X-Y plane are separated from each other by the insulating layer 42, the gate insulating film 40, the mask insulating film 44, and the insulating layer 46. The insulating layer 42 is comprised, for example, of glass including $SiO_2$ as a main component or of $SiO_2$ or the like.

In a region within the X-Y plane other than the region where the plurality of column portions 22 are formed, an interlayer insulating layer 200 is provided across the Z direction, for example, between the metal layers 12 and 60, the semiconductor layer 30 of the channel formation region D, the semiconductor layer 20 of the source region S, and the like.

In the semiconductor device 10 described above, the impurity concentration of the semiconductor layer 21B is set to be lower than the impurity concentration of the semiconductor layer 21A, 21C. In addition, when the gate electrode 50 is not supplied with a voltage equal to or more than a threshold value, no electric current flows between the drain region D and the source region S. Once the gate electrode 50 is supplied with a voltage equal to or more than the threshold value, the region Ch of channel is formed at the semiconductor layer 21B of the channel formation region R adjacent to the gate electrode 50 with the gate insulating film 40 being interposed therebetween. Electrons of $n^+$-GaN that constitutes the semiconductor layer 21C of the source region S and electrons of $n^-$-GaN that constitutes the semiconductor layer 21A of the drain region D are strongly attracted to the region Ch, which makes the region Ch serve as a flow path of electrons. This results in a flow of electric current between the drain region D and the source region S. The size of the region Ch of channel formed at the channel formation region R is controlled on the basis of the voltage supplied to the gate electrode 50, and the value of electric current flowing between the drain region D and the source region S changes. That is, the electric current between the drain region D and the source region S is controlled by the gate electrode 50.

Next, description will be made of a method of manufacturing the semiconductor device 10 according to the first embodiment. FIGS. 3 to 14 are cross-sectional views each illustrating one step of the method of manufacturing the semiconductor device 10.

Figure 3:
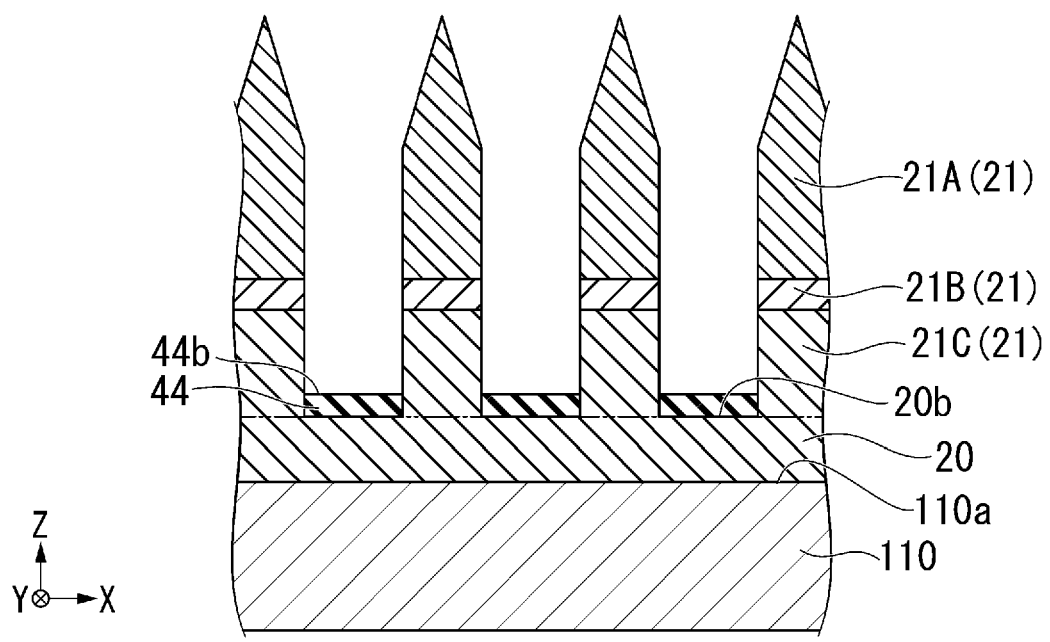
FIG. 3 is a cross-sectional view used to explain a method of manufacturing the semiconductor device illustrated in FIGS. 1 and 2.

As illustrated in FIG. 3, crystal of $n^+$-GaN is first caused to grow at a front surface 110a of a substrate 110 used to grow GaN crystal, for example, by using a metal organic chemical vapor deposition (MOCVD) method or a molecular beam epitaxy method (MBE) to form the semiconductor layer 20. For example, a sapphire substrate can be used for the substrate 110.

Next, a film of $SiO_2$ is formed at the front surface 20b of the semiconductor layer 20, for example, by using a chemical vapor deposition (CVD) method or a physical vapor deposition (PVD) method, to form the mask insulating film 44. Then, only the mask insulating film 44 stacked at a region of the front surface 20b of the semiconductor layer 20 where the plurality of column portions 22 are to be formed is removed, for example, by using photolithography or an etching method, to cause the front surface 20b of the semiconductor layer 20 of this region to be exposed.

Next, for example, by using the MBE, crystal of $n^+$-GaN is caused to grow to have a predetermined height in the Z direction at the front surface 20b of the semiconductor layer 20 that has been exposed in the previous step, to form the semiconductor layer 21C. Then, the front surface of the semiconductor layer 21C is flattened so as to be parallel to the X-Y plane, and crystal of u-GaN is caused to grow at this front surface to have a predetermined height in the Z direction by, for example, using the MBE, to form the semiconductor layer 21B. Furthermore, the front surface of the semiconductor layer 21B is flattened, and crystal of $n^-$-GaN is caused to grow at this front surface to have a predetermined height in the Z direction by using, for example, the MBE, to form the semiconductor layer 21A. Alternatively, it may be possible to consecutively form the 21C, 21B, and 21A by varying the concentration of dopant, for example, the concentration of Si. In other words, in the method of manufacturing the semiconductor device 10, the semiconductor 21 that constitutes the column portion 22 is formed in the bottom-up manner in the Z direction from the semiconductor layer 20 that is eventually to be the source region S.

The front surface of the semiconductor layer 21A may have concave and convex portions with respect to the X-Y plane, and may not be flattened in the stage illustrated in FIG. 3. Note that, when the semiconductor layers 21C, 21B, and 21A are caused to grow by using the MBE or MOCVD, each outermost surface may have a conical shape. Thus, it is preferable to cause each of the semiconductor layers 21C, 21B, and 21A to grow in the Z direction to have a sufficient height so that the minimum size of each of the semiconductor layers 21C, 21B, and 21A in the Z direction is equal to or greater than the size, in the Z direction, of the semiconductor layer 21A, 21B, 21C of each of the column portions 22 illustrated in FIG. 2.

Figure 4:
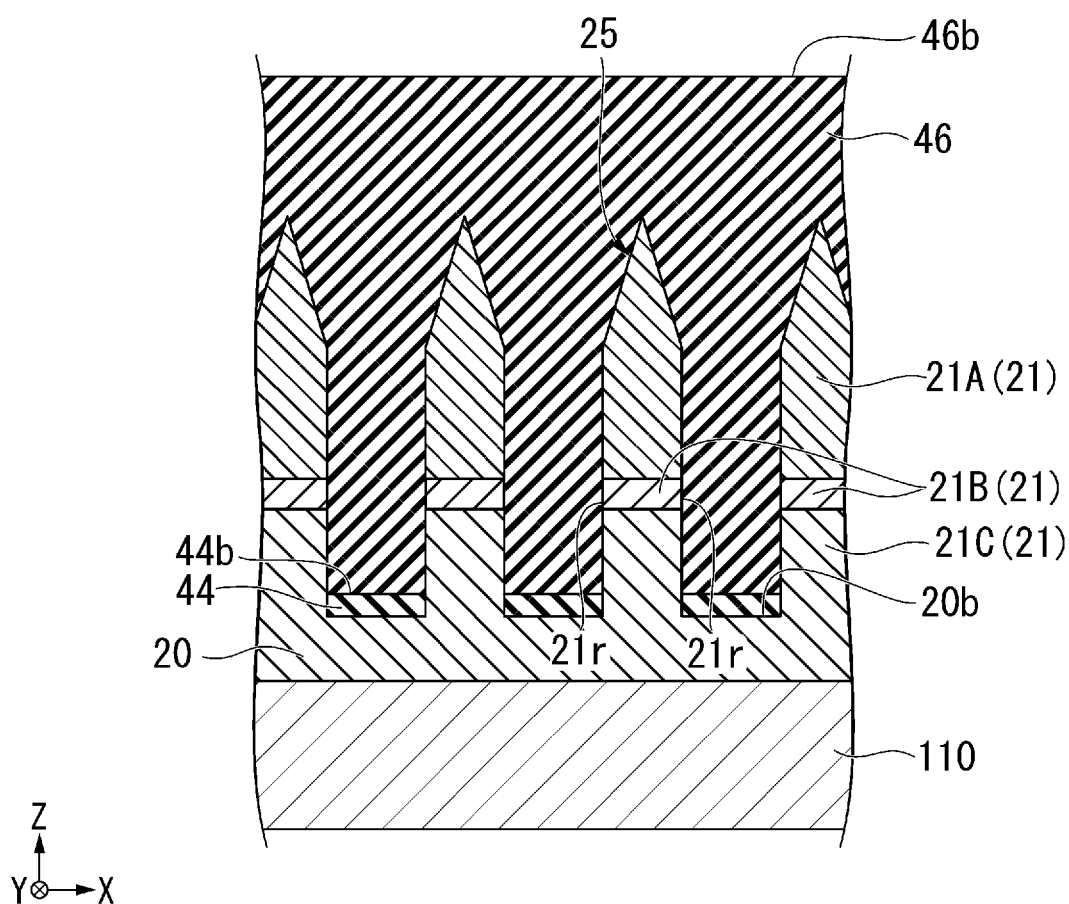
FIG. 4 is a cross-sectional view used to explain a method of manufacturing the semiconductor device illustrated in FIGS. 1 and 2.

Next, for example, by using spin coating, a spin-on-glass (SOG) solution is applied and processing is performed so as to cover the front surface of the mask insulating film 44, that is, a surface to be a bottom surface 44a and the columnar body 25 comprised of the semiconductor layers 21C, 21B, and 21A, to form the insulating layer 46 made of $SiO_2$ or the like as illustrated in FIG. 4. Through these processes, the side wall 21r of the semiconductor layer 21B, the side wall of each of the semiconductor layers 21C and 21A, and the front surface of the semiconductor layer 21A are in contact with the insulating layer 46. The front surface 46b of the insulating layer 46 is disposed at a position higher than the leading end of the columnar body 25 in the Z direction, that is, more forward in the Z direction.

Figure 5:
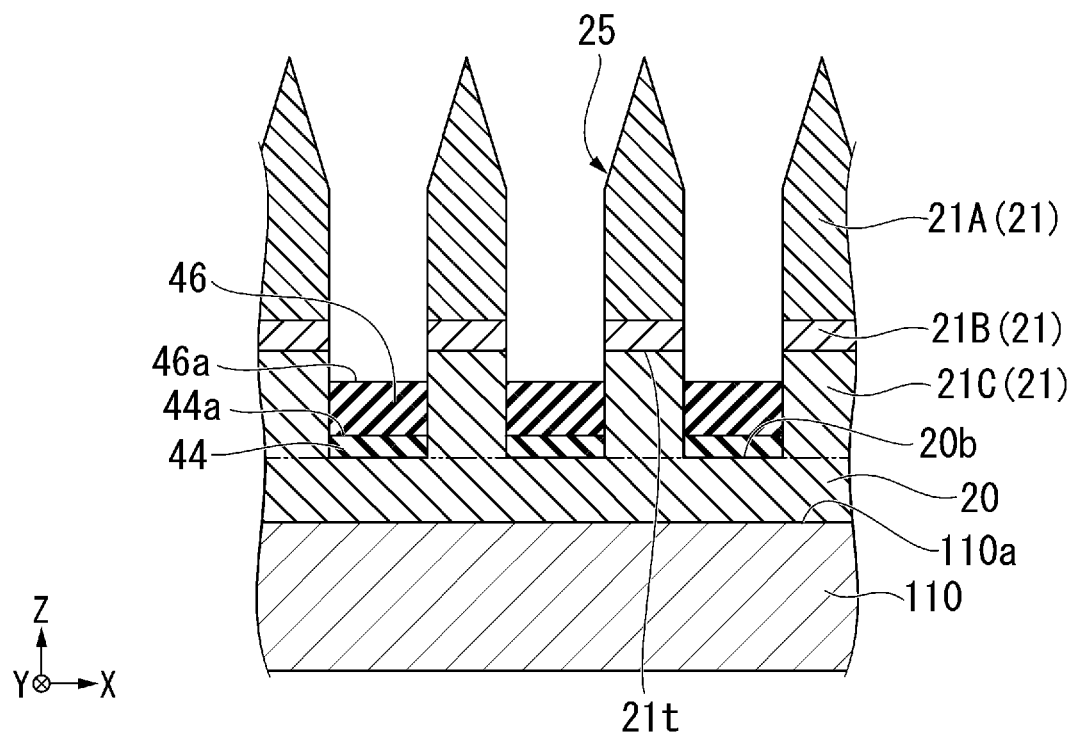
FIG. 5 is a cross-sectional view used to explain a method of manufacturing the semiconductor device illustrated in FIGS. 1 and 2.

Next, as illustrated in FIG. 5, etching back is performed to the insulating layer 46 until the front surface 46b sits at an appropriately lower position in the Z direction than the bottom surface 21t, which is eventually to be a front surface, of the semiconductor layer 21B of the columnar body 25.

Figure 6:
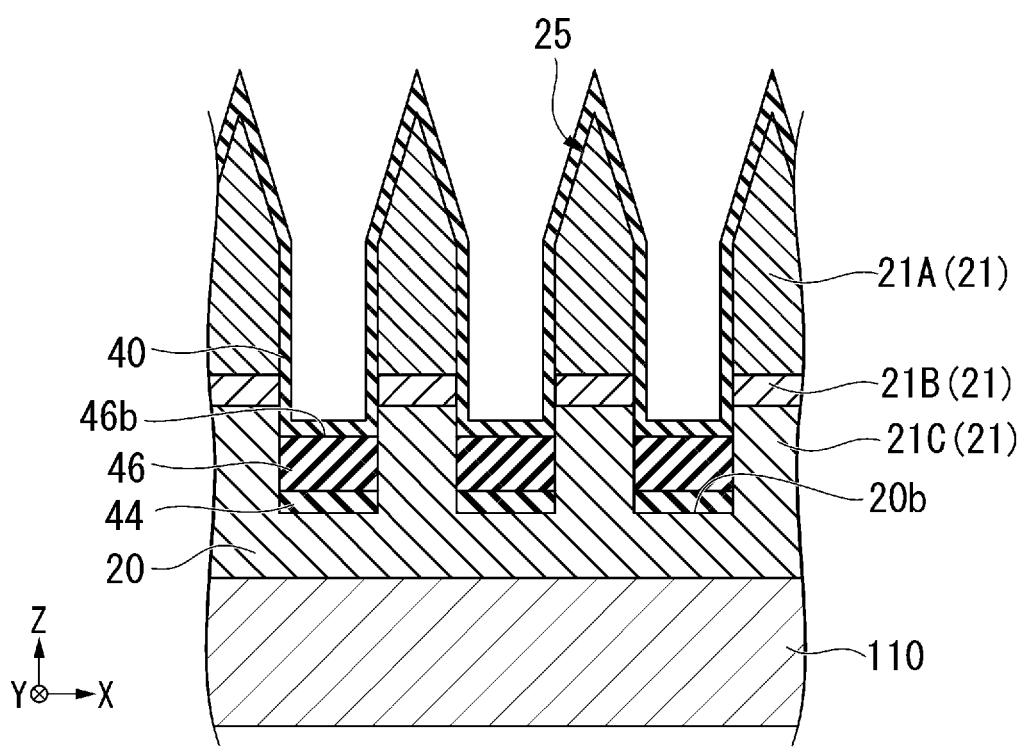
FIG. 6 is a cross-sectional view used to explain a method of manufacturing the semiconductor device illustrated in FIGS. 1 and 2.

Next, for example, by using an atomic layer deposition (ALD) method, $SiO_2$ is deposited in a film manner so as to apply coating to the front surface 46b of the insulating layer 46 and the side wall of and the front surface of the exposed columnar body 25, to form the gate insulating film 40 as illustrated in FIG. 6.

Figure 7:
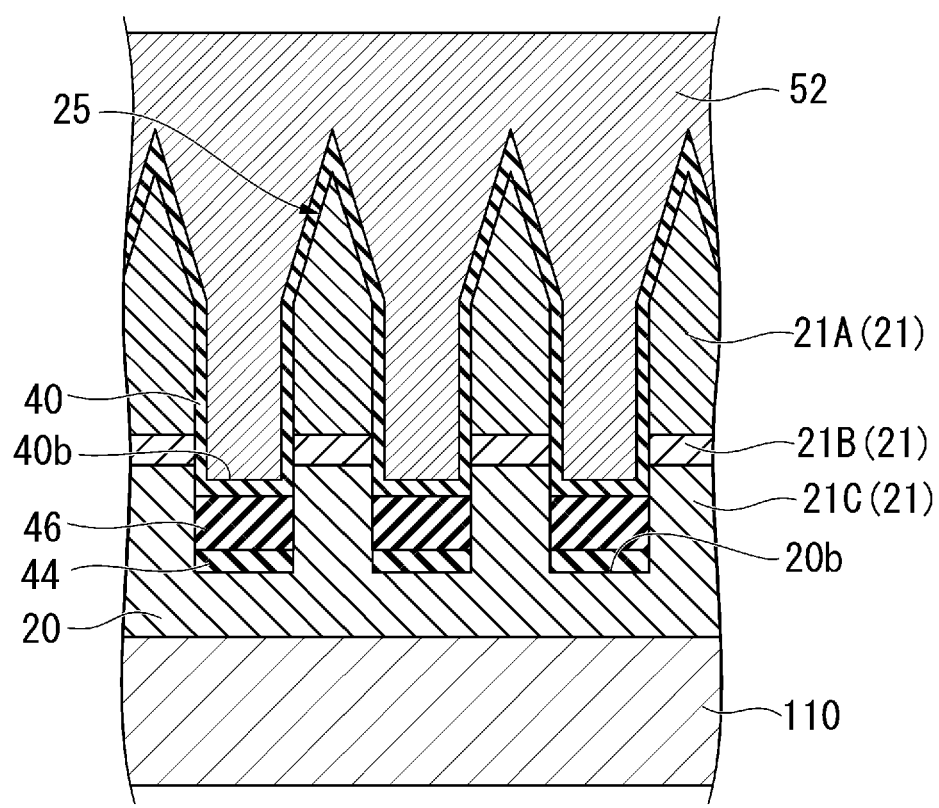
FIG. 7 is a cross-sectional view used to explain a method of manufacturing the semiconductor device illustrated in FIGS. 1 and 2.
Figure 8:
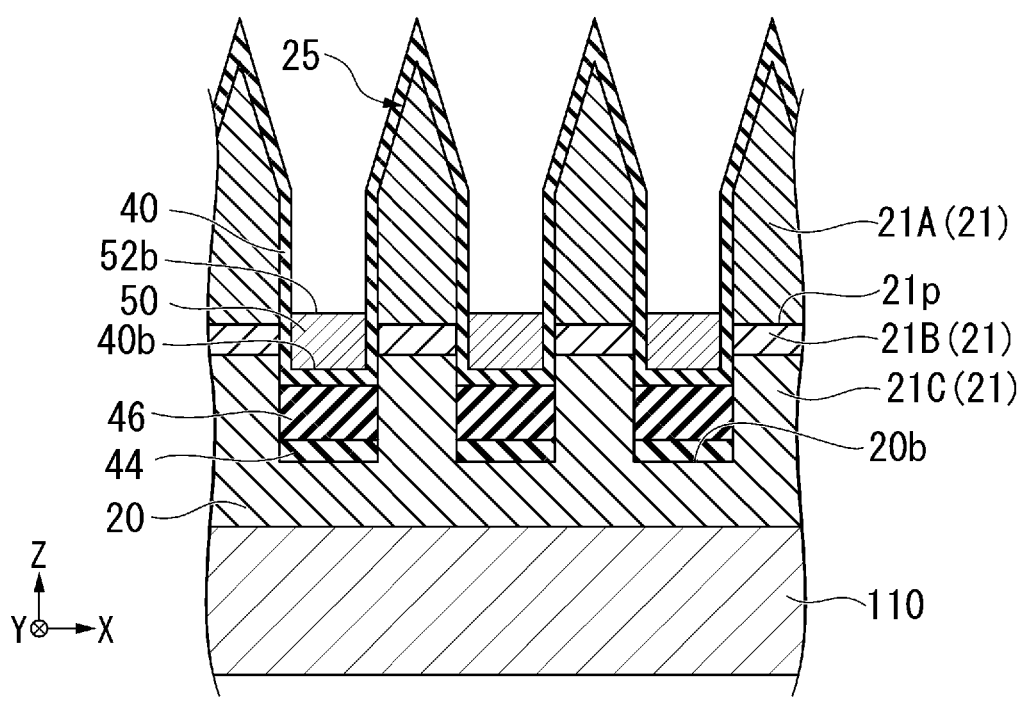
FIG. 8 is a cross-sectional view used to explain a method of manufacturing the semiconductor device illustrated in FIGS. 1 and 2.

Next, B-doped Poly-Si is deposited in the Z direction from the front surface, which is eventually to be the bottom surface 40b, of the gate insulating film 40 stacked at the insulating layer 46 up to a position that entirely covers the gate insulating film 40 that covers the columnar body 25, to form a precursor layer 52 of the gate electrode 50 as illustrated in FIG. 7. B-dope may be thermally diffused by injecting boron ions into Poly-Si. Then, as illustrated in FIG. 8, etching back is performed to the precursor layer 52 until the front surface 52b sits at an appropriately higher position in the Z direction than the front surface, which is eventually to be the bottom surface 21p, of the semiconductor layer 21B of the columnar body 25, to form the gate electrode 50.

Figure 9:
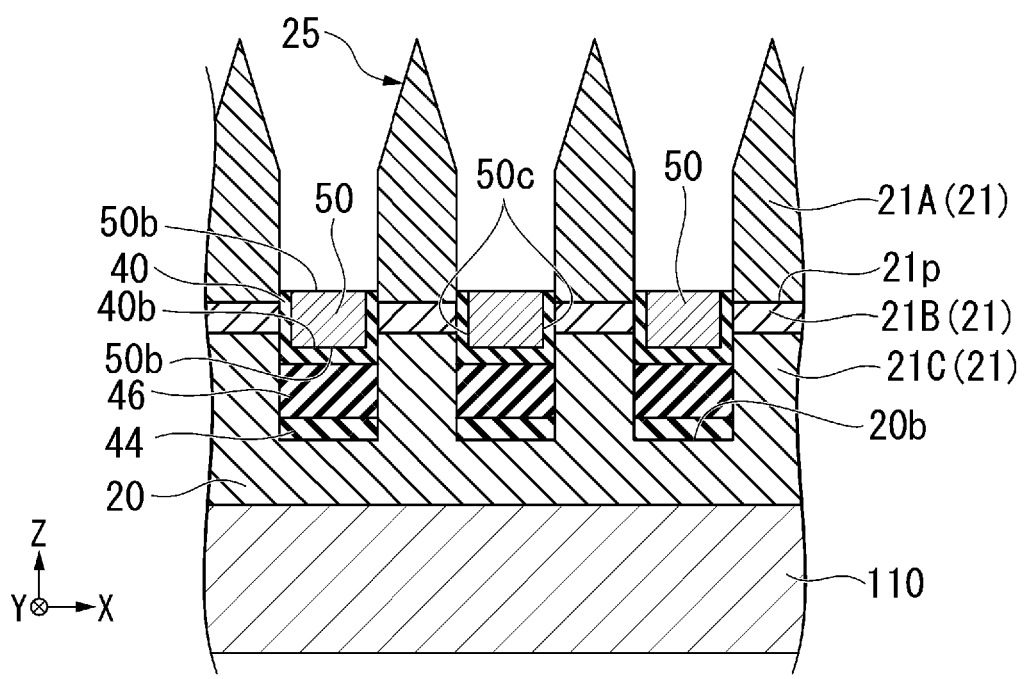
FIG. 9 is a cross-sectional view used to explain a method of manufacturing the semiconductor device illustrated in FIGS. 1 and 2.

Next, as illustrated in FIG. 9, the gate insulating film 40 exposed in the Z direction from the front surface, which is eventually to be the bottom surface 50b, of the gate electrode 50 is removed, for example, through wet etching using a chemical solution or the like. With this process, the gate insulating film 40 that surrounds the side wall 50c and the front surface 50b of the gate electrode 50 is left.

Figure 10:
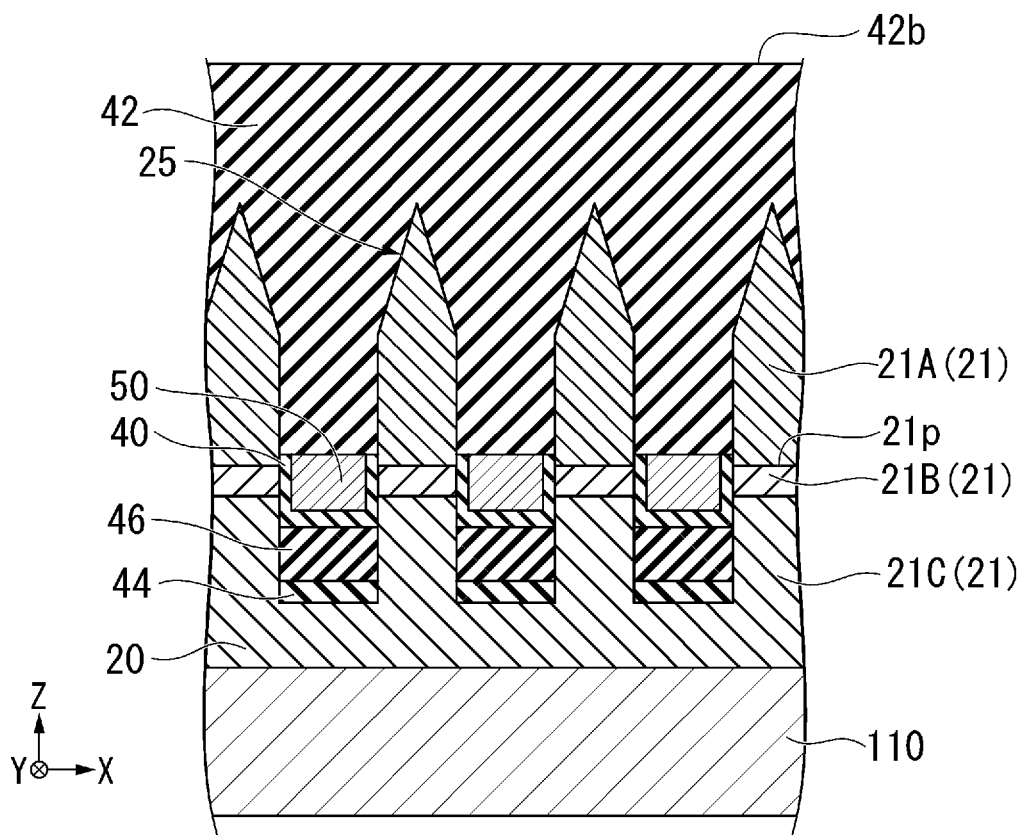
FIG. 10 is a cross-sectional view used to explain a method of manufacturing the semiconductor device illustrated in FIGS. 1 and 2.
Figure 11:
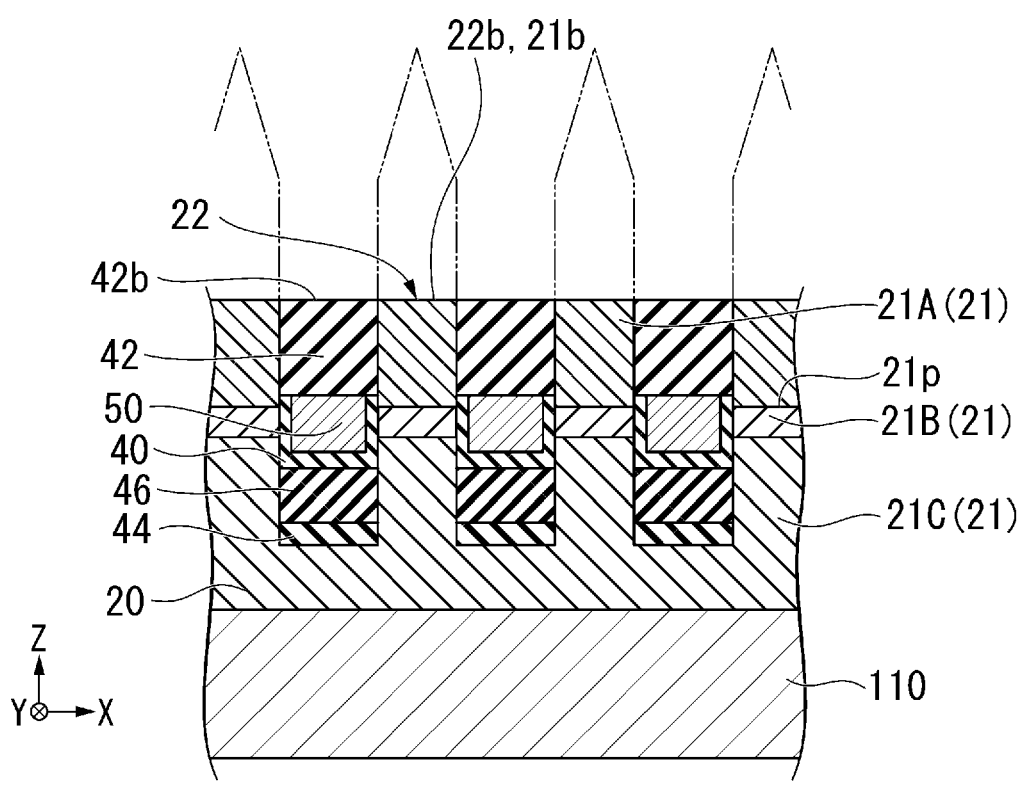
FIG. 11 is a cross-sectional view used to explain a method of manufacturing the semiconductor device illustrated in FIGS. 1 and 2.

Next, a SOG solution is applied and processing is performed so as to cover the columnar body 25 protruding and exposed in the Z direction from the front surface of the gate electrode 50, to form the insulating layer 42 as illustrated in FIG. 10. Then, as illustrated in FIG. 11, by using a chemical mechanical polishing (CMP) method, an etching back method, an etching method under an atmosphere of a hydrogen and ammonia mixture, or the like, the insulating layer 42 is flattened until the front surface, that is the bottom surface 42b, of the insulating layer 42 reaches the most rear side in the Z direction of the surface having concave and convex portions of the semiconductor layer 21A, and an appropriately front side of the semiconductor layer 21B in the Z direction, that is, a position higher than the semiconductor layer 21B. With this process, the bottom surface 42b of the insulating layer 42 and a portion that is eventually to be the bottom surface 22b of each of the plurality of column portions 22 are formed so as to be flush with each other, and the thicknesses (predetermined thicknesses), in the Z direction, of the insulating layer 42 and the semiconductor layer 21A are secured.

Figure 12:
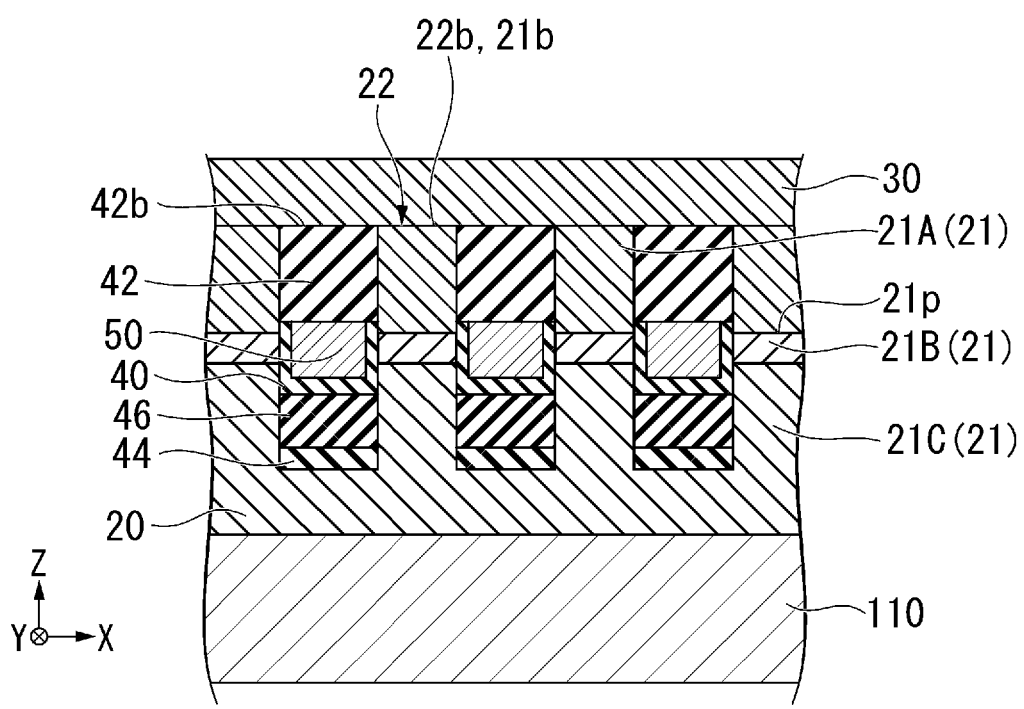
FIG. 12 is a cross-sectional view used to explain a method of manufacturing the semiconductor device illustrated in FIGS. 1 and 2.

Next, as illustrated in FIG. 12, by using, for example, the MBE, crystal of $n^+$-GaN is caused to grow to have a predetermined height in the Z direction over the entire flat surface comprised of the bottom surface 22b of each of the plurality of column portions 22 and the bottom surface 42b of the insulating layer 42, to form the semiconductor layer 30.

Figure 13:
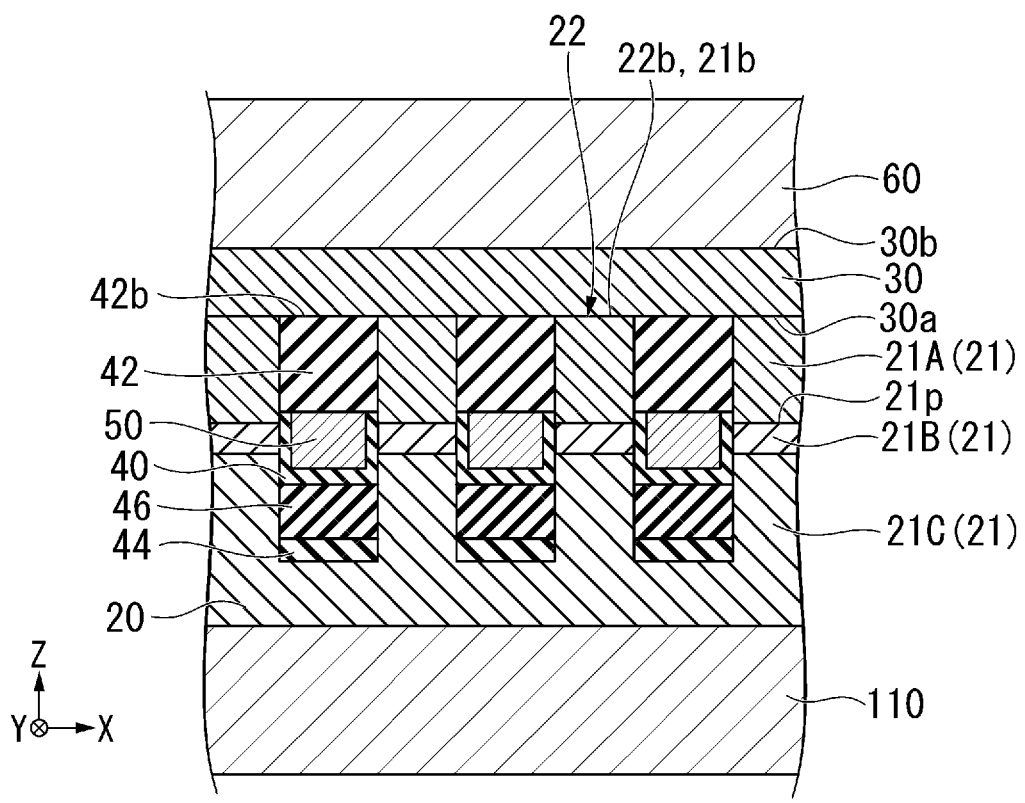
FIG. 13 is a cross-sectional view used to explain a method of manufacturing the semiconductor device illustrated in FIGS. 1 and 2.

Next, as illustrated in FIG. 13, in a region where the plurality of column portions 22 are formed in the X-Y plane, an adhesive, which is not illustrated, is applied to the front surface, which is eventually to be the bottom surface 30b, of the semiconductor layer 30 to glue the metal layer 60. The adhesive used includes, for example, ultraviolet curing resin or thermosetting resin. However, there is no particular limitation, and it is possible to use any glue that can favorably glue the metal layer 60 to the bottom surface 30b of the semiconductor layer 30. For example, instead of the adhesive, metal for gluing may be deposited.

Although illustration is not given, in a region within the X-Y plane other than the region where the plurality of nano-columns 22 are formed, lithography and a dry etching method are used to remove an interlayer insulating layer of a region where a conductive layer 71 that is in contact with the gate electrode 50 is disposed, the interlayer insulating layer being disposed more toward the Z direction than the gate electrode 50. A contact hole is formed through this process. In addition, for example, lithography and a CNT etching method are used to remove an interlayer insulating layer of a region where a conductive layer 73 that is in contact with the semiconductor layer 20 of the source region S is disposed, the interlayer insulating layer being disposed more toward the Z direction than the semiconductor layer 20. A contact hole is formed through this process. Then, for example, a CVD method is used to deposit W within each contact hole and a portion located more toward the Z direction than the contact hole to form a gate conductive layer and a source conductive layer. After this, etching back is performed to the gate conductive layer and the source conductive layer until the front surfaces of the gate conductive layer 71 and the source conductive layer are flush with the front surface 20a of the semiconductor layer 20. An adhesive is used to glue the gate metal layer and the source metal layer to the front surfaces of the gate conductive layer and the source conductive layer.

Figure 14:
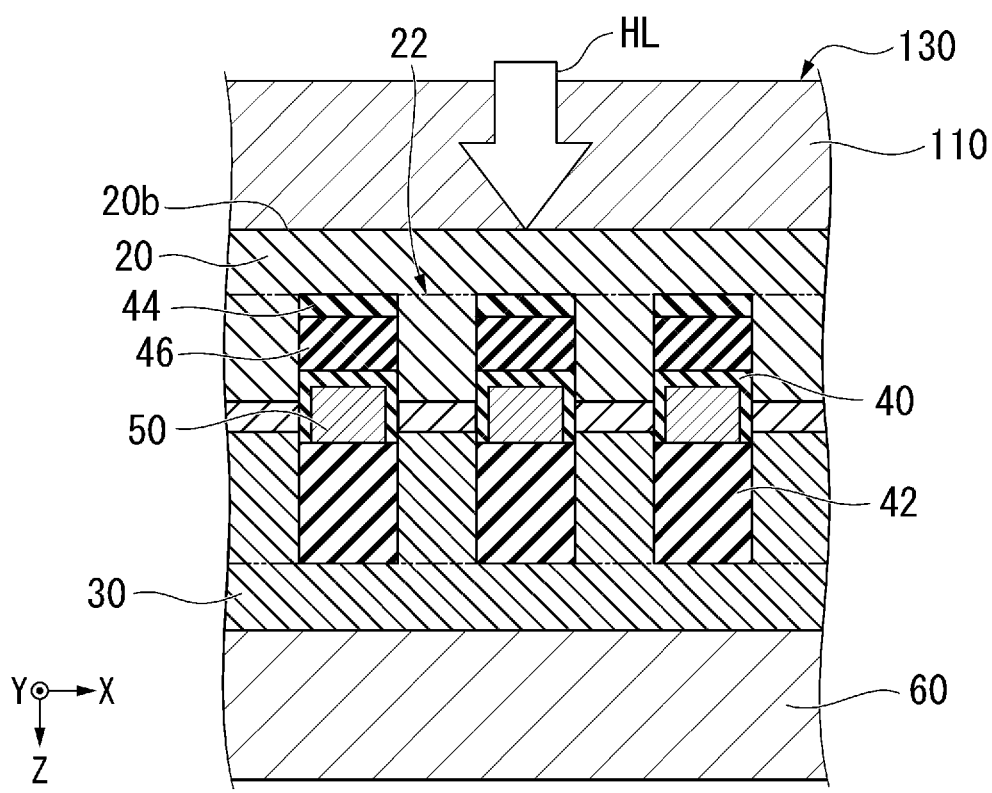
FIG. 14 is a cross-sectional view used to explain a method of manufacturing the semiconductor device illustrated in FIGS. 1 and 2.

Next, the substrate 110 is removed from a stacked structural body 130 including the substrate 110, the semiconductor layers 20, 21C, 21B, and 21A, the mask insulating film 44, the insulating layer 46, the gate insulating film 40, the gate electrode 50, the insulating layer 42, the semiconductor layer 30, and the metal layer 60 that have been manufactured on and before the previous process. Specifically, as illustrated in FIG. 14, the stacked structural body 130 is inverted in the Z direction, and for example, a laser lift off (LLO) process is performed. In the LLO process, a high-power laser light source, which is not illustrated, emits laser light HL from behind the substrate 110 in the Z direction to peel the substrate 110 from the semiconductor layer 20. When the substrate 110 is a sapphire substrate, krypton fluoride (KrF) excimer laser is preferable for the high-power laser light source. When the KrF excimer laser is used, the center wavelength of the laser light HL is approximately 248 nm.

Next, an adhesive, which is not illustrated, is applied to the front surface 20a of the semiconductor layer 20 that is exposed after the substrate 110 is peeled off, to glue the metal layer 12. The adhesive used includes, for example, ultraviolet curing resin or thermosetting resin or the like. However, there is no particular limitation, and it is possible to use any glue that can favorably glue the metal layer 12 to the front surface 20a of the semiconductor layer 20. For example, instead of the adhesive, metal for gluing may be deposited. Furthermore, in a region within the X-Y plane where the plurality of column portions 22 are formed, it may be possible to form, for example, wire boding that is in contact with the gate electrode 50. In addition, wire bonding may be formed at the metal layer 12.

By performing the processes described above, the main structure of the semiconductor device 10 illustrated in FIG. 2 is manufactured. Although illustration is not given, post processes are performed as necessary to complete the semiconductor device 10.

Operation Effect

The semiconductor device 10 according to the first embodiment described above includes the plurality of column portions 22 made of the semiconductor 21. The plurality of column portions 22 each include the source region S, the drain region D, the channel formation region R, the gate electrode 50, the semiconductor layer 30, and the metal layer 60. The channel formation region R includes the region (channel area) Ch of a channel formed between the source region S and the drain region D. The gate electrode 50 is provided at the side wall 21r of the semiconductor layer 21B that constitutes the channel formation region R with the gate insulating film 40 being interposed between the gate electrode 50 and the side wall 21r. The semiconductor layer 30 is coupled to the drain region D of each of the plurality of column portions 22. The metal layer 60 is coupled to the semiconductor layer 30 in the Z direction.

In the semiconductor device 10 according to the first embodiment, the basic structure of a transistor is comprised of the plurality of column portions 22 and the gate electrode 50 adjacent to the channel formation region R with the gate insulating film 40 being interposed between the gate electrode 50 and the channel formation region R. The size of each of the plurality of column portions 22 in the Z direction is greater than the size thereof in the X direction and the Y direction, and each of the plurality of column portions 22 is formed into a columnar shape. This makes it possible to increase the denseness of the column portions 22 in a certain area of the X-Y plane. At the same time, it is considered that this also leads to an excessive increase in the contact resistance between the semiconductor layer 21A that constitutes the drain region D and the metal layer coupled to the semiconductor layer 21A. However, in the semiconductor device 10 according to the first embodiment, the semiconductor layers 21A of the plurality of column portions 22 are coupled to the semiconductor layer 30 extending along the X-Y plane, and are coupled to the metal layer 60 through the semiconductor layer 30. That is, end portions of the plurality of column portions 22 in the Z direction are coupled to the semiconductor layer 30 having the same quality and extending in the X-Y plane, and the semiconductor layer 30 and the metal layer 60 that constitutes an electrode of the drain region D are in contact with each other at the X-Y plane. Thus, the semiconductor device 10 according to the first embodiment suppresses an increase in the contact resistance at coupling between the metal layer 60 and the plurality of column portions 22 each having a small diameter at the X-Y plane. Furthermore, the semiconductor device 10 according to the first embodiment prevents a deterioration in the performance, and can favorably perform operation.

In addition, the semiconductor device 10 according to the first embodiment further includes the semiconductor layer 20 coupled to the source region S of each of the plurality of column portions 22, and also includes the metal layer 12 coupled to the semiconductor layer 20. In the semiconductor device 10 according to the first embodiment, end portions of the plurality of column portions 22 in the Z direction are coupled to the semiconductor layer 20 having the same quality and extending in the X-Y plane, and the semiconductor layer 20 that constitutes the source region S and the metal layer 12 that constitutes an electrode of the source region S are in contact with each other at the X-Y plane. Thus, in addition to the drain region D, even in the source region S, the semiconductor device 10 according to the first embodiment suppresses an increase in the contact resistance at coupling between the metal layer 12 and the plurality of column portions 22 each having a small diameter at the X-Y plane. Furthermore, the semiconductor device 10 according to the first embodiment prevents a deterioration in the performance, and can favorably perform operation.

In the semiconductor device 10 according to the first embodiment, the semiconductor layers 21A and 30 are similarly made of the n-type semiconductor, and the effect of suppressing the contact resistance between the semiconductor layer 21A and the metal layer 60 is large. In a similar manner, the semiconductor layers 21C and 20 are similarly made of the n-type semiconductor, and specifically, is made of n-GaN. This leads to an increase in the effect of suppressing the contact resistance between the semiconductor layer 21C and the metal layer 12.

Note that, in the configuration of a typical semiconductor device, each electrode of the drain region or the source region is coupled to end portions of a plurality of column portions, and hence, the area of interface between the electrode and the semiconductor layer at the end portion of the column portion is small, which results in a high contact resistance at the ohmic joining. In addition, when the semiconductor device is manufactured by using an etching process in the top-down manner, a metal layer that constitutes an electrode is formed at the stacking body that constitutes various types of insulating layers, the gate insulating film, the gate electrode, and the like. Then, by using the metal layer as a mask, a hole used to form the column portion is formed. In addition, a semiconductor used to form the column portion is deposited or is caused to grow within the hole. In a case of a typical semiconductor device manufactured in the top-down manner, since the metal layer exists before the column portion is form as described above, a semiconductor layer used in a process at high temperatures at the time of formation is difficult to be interposed between an end portion of the column portion and the metal layer serving as a mask.

In a case of the semiconductor device 10 according to the first embodiment, since a GAA electrode vertical-type transistor is formed in the bottom-up manner, the semiconductor 21 of the column portion 22 is caused to grow in the Z direction using the MBE method as described above; both end portions of the column portion 22 in the Z direction are caused to temporarily form a bridge between the semiconductor layers 20 and 30 extending in the X and Y directions; and the contact region increases as compared with a configuration in which no semiconductor layer 20, 30 is provided; and the contact resistance can be significantly improved.

In addition, in the semiconductor device 10 according to the first embodiment, the impurity concentration of the semiconductor layer 30 is higher than the impurity concentration of the semiconductor 21 that constitutes the semiconductor layer 21A of the channel formation region R. Specifically, $n^+$-GaN is used for the semiconductor layer 30, and $n^-$-GaN is used for the semiconductor layer 21A. With the semiconductor device 10 according to the first embodiment, while the withstand voltage can be secured due to a difference between high and low impurity concentrations, the electrical conductivity sequentially increases at the semiconductor layers 21A and 30 and the metal layer 60, and the contact resistance can be efficiently suppressed in an ON state.

In addition, in the semiconductor device 10 according to the first embodiment, the gate electrode 50 is made of Poly-Si. This enables the semiconductor device 10 according to the first embodiment to raise the heat resistance of the gate electrode 50.

In addition, in the semiconductor device 10 according to the first embodiment, B is doped in Poly-Si that constitutes the gate electrode 50. With this configuration, the semiconductor device 10 according to the first embodiment enables the work function of the gate electrode 50 to increase. With the gate electrode 50 having the increased work function, it is possible to obtain a normally-off property in which the electric current is shut off at the time of zero bias in the semiconductor device 10. For example, a power device is strongly demanded to have the normally-off property for the purpose of preventing occurrence of a short circuit or flame ignition in the ON state. Thus, by forming the gate electrode 50 of the semiconductor device 10 using Poly-Si with B dope, it is possible to enhance the suitability as a power device.

In addition, in the semiconductor device 10 according to the first embodiment, the semiconductors 21 of the source region S and the drain region D are n-type semiconductors. With this configuration, in the semiconductor device 10 according to the first embodiment, a large number of electrons serving as carriers exist in the column portion 22. Thus, when a voltage equal to or more than a threshold value is applied to the gate electrode 50, electric current efficiently flows. This makes it possible to reduce the on-resistance of the semiconductor device 10, as compared with the configuration in which a p-type semiconductor is used. When the semiconductor device 10 is applied, for example, to an inverter, the on-resistance is low as described above, and hence, it is possible to reduce a loss occurring when the output is returned to use as power, which is useful.

The semiconductor device 10 according to the first embodiment includes a GAA-type FET including: the column portion 22 including the source region S and the drain region D, each of which is made of n-GaN, and the channel formation region R made of u-GaN; and the gate electrode adjacent to the channel formation region R with the gate insulating film being interposed therebetween. By forming the region Ch of channel of the column portion 22 using u-GaN and setting a small diameter equal to or less than 0.5 µm in the X-Y plane relative to the axis core parallel to the Z direction, it is possible to make u-GaN of the channel formation region R fully depleted without using p-GaN. In addition, the electron mobility and the activation rate of p-GaN are lower than those of n-GaN, and the resistance of p-GaN is higher than that of the n-GaN. However, in a case of the semiconductor device 10, p-GaN is not used as described above. Furthermore, by using u-GaN, the diffusion of impurities in the channel formation region R is small, and the electron mobility is high. These make the on-resistance of the semiconductor device 10 reduced, and make it possible to achieve high efficiency. In addition, the GAA-type FET of the semiconductor device 10 has a low sub-threshold swing (SS) value, which indicates the degree of steepness of the rise of an on-off property, that is, the property concerning the rise is favorable, and a large electric current can be easily taken out. In the GAA-type FET of the semiconductor device 10, by using a value of voltage supplied to the gate electrode, it is possible to control the spread of the depletion layer in a highly accurate manner, and it is also possible to shorten the length of the region Ch of channel in the Z direction, that is, the channel length. Furthermore, in the GAA-type FET of the semiconductor device 10, p-GaN is not used, and no pn junction is provided, which makes it possible to achieve rapid return at the time of switching the on-off property. These make it possible for the semiconductor device 10 to have a high switching frequency. Thus, the semiconductor device 10 according to the first embodiment is suitable for a power device that is required to have the reduced on-resistance and have high switching speed.

In the semiconductor device 10 according to the first embodiment, the plurality of column portions 22 each have a small diameter in the X-Y plane relative to the Z direction, and can be arranged in a highly dense manner so as to be spaced apart from each other within the X-Y plane. Thus, when viewed along the Z direction, the total length per area of the region Ch where channel is formed can be set to be significantly long relative to a structure in which the channel region is formed so as to be parallel to one direction of the X-Y plane as in a typical semiconductor device. This makes it possible to reduce the on-resistance, which makes it possible to reduce a loss as a power device.

The semiconductor device 10 according to the first embodiment has a potential to achieve a completely flawless column portion 22, and can be manufactured through a manufacturing method using a LLO process without using an expensive GaN substrate. In addition, by providing the semiconductor layer 20, 30 between each of the plurality of column portions 22 and the metal layer 12, 60 serving as a substrate, the semiconductor device 10 is able to achieve a low on-resistance that exceeds the limitation of resistance resulting from the metal layer 12, 60. Furthermore, it is possible to use a metal substrate that constitutes the metal layer 12, 60 in place of a typical GaN substrate, Si substrate, or the like, which makes it possible to enhance a heat dissipating property of the semiconductor device 10.

Second Embodiment

Next, a semiconductor device according to a second embodiment of the present disclosure will be described with reference to FIGS. 15 to 20. In the exemplary embodiment of the second embodiment, configurations common to the first embodiment are denoted with the same reference characters as the configurations according to the first embodiment, and explanation thereof will not be repeated. Below, a semiconductor device according to the second embodiment will be described with focus being on the configurations differing from those of the semiconductor device 10 according to the first embodiment.

Figure 15:
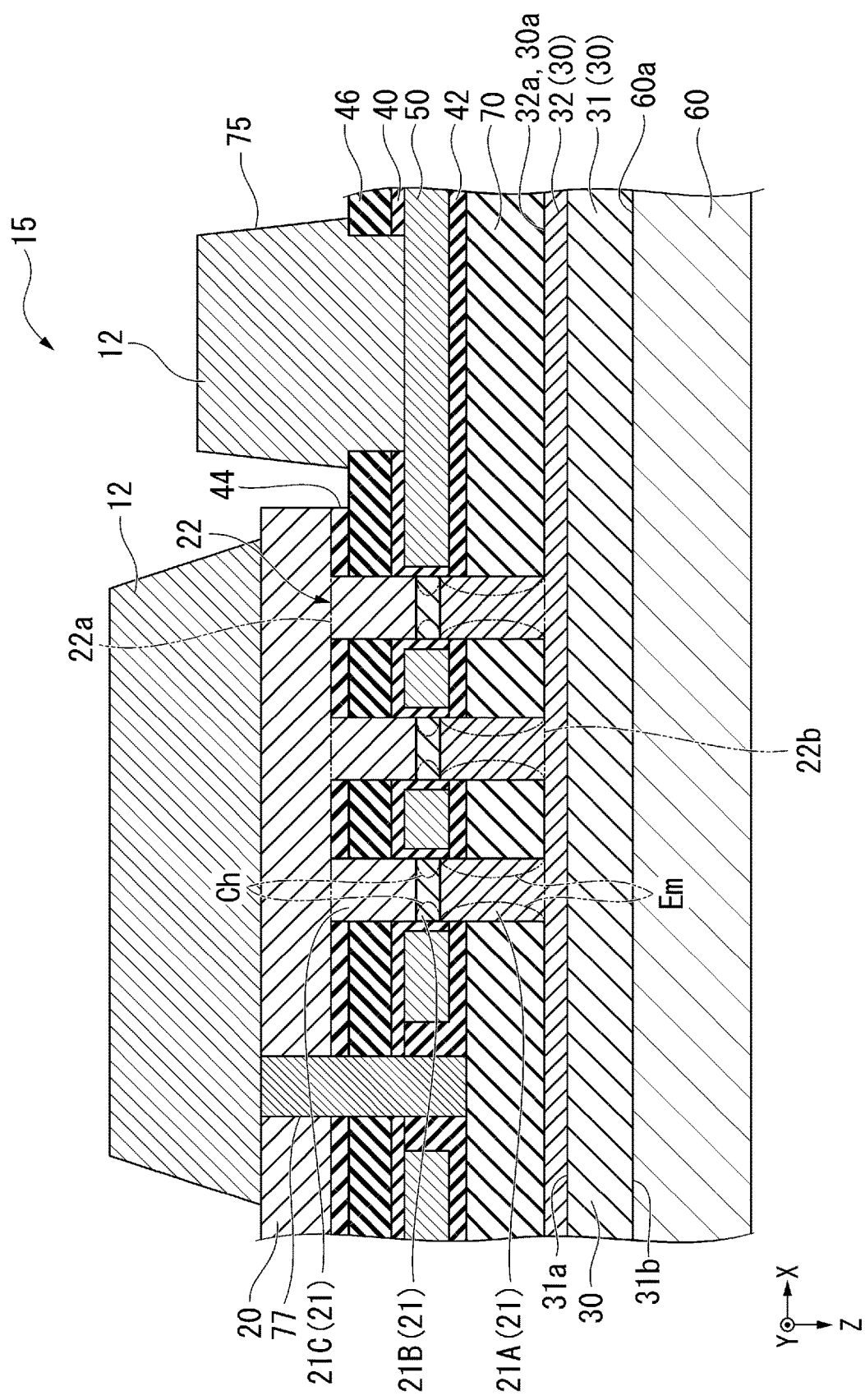
FIG. 15 is a cross-sectional view illustrating a main portion of a semiconductor device according to a second embodiment, and is also a cross-sectional view corresponding to the view that is viewed toward the arrow of the line C1-C1 in FIG. 1.

FIG. 15 is a cross-sectional view illustrating the semiconductor device 11 according to the second embodiment, and is also a cross-sectional view corresponding to the view that is viewed toward the arrow of the line C1-C1 in FIG. 1. As illustrated in FIG. 15, in the semiconductor device 11 according to the second embodiment, the semiconductor layer 30 has a two-layer structure including a first layer 31 and a second layer 32. The first layer 31 extends along the X-Y plane, and is disposed at the rear side of the semiconductor layer 30 in the Z direction, that is, at a lower portion of the semiconductor layer 30. A bottom surface 31b of the first layer 31 is in contact with the front surface 60a of the metal layer 60. The second layer 32 is provided between the first layer 31 and each of the plurality of column portions 22 in the Z direction. In addition, the second layer 32 extends along the X-Y plane, and is disposed at the front side of the semiconductor layer 30 in the Z direction, that is, at an upper portion of the semiconductor layer 30. A front surface 32a of the second layer 32 is in contact with the bottom surfaces 22b of the plurality of column portions 22. A bottom surface 32b of the second layer 32 is in contact with the front surface 31a of the first layer.

The first layer 31 is made of an n-type semiconductor, and is made, for example, of $n^+$-GaN. On the other hand, the second layer 32 is made of an n-type semiconductor having the impurity concentration lower than the n-type semiconductor that constitutes the first layer 31. The second layer 32 is made, for example, of the n-type semiconductor similar to that of the semiconductor layer 21A that constitutes the drain region D of the plurality of column portions 22, and specifically, is made of $n^-$-GaN.

A semiconductor layer 70 is provided between the insulating layer 42 and the second layer 32 of the semiconductor layer 30 in the Z direction. The semiconductor layer 70 has an electrical conductivity differing from at least the semiconductor 21 that constitutes the semiconductor layer 21A. The semiconductor layer 70 is made, for example, of a p-type semiconductor. The p-type semiconductor includes, for example, GaN doped with a p-type impurity. The p-type impurity includes, for example, magnesium (Mg), zinc (Zn), and the like. Hereinafter, GaN doped with a p-type impurity may be referred to as p-GaN. In addition, of p-GaN, p-GaN having a relatively higher impurity concentration may be referred to as $p^+$-GaN, and p-GaN having a relatively lower impurity concentration may be referred to as $p^-$-GaN. The impurity concentration is independent of the electrical conductivity of the semiconductor.

In a case of the semiconductor device 11 according to the second embodiment, the semiconductor layer 70 is added to the basic configuration of the FET of the semiconductor device 10 to form a super junction (SJ) structure. The semiconductor layer 21A that constitutes the drain region D of each of the plurality of column portions 22 is adjacent to the semiconductor layer 70 within the X-Y plane. In other words, the semiconductor layer 21A made of $n^-$-GaN and the semiconductor layer 70 made of $p^+$-GaN are alternately disposed so as to be adjacent to each other within the X-Y plane.

A conductive layer 77 coupled to the metal layer 12 in the Z direction is provided in a region of the semiconductor layer 70 where the plurality of column portions 22 are not formed in the X-Y plane. That is, the semiconductor layer 70 and the metal layer 12 that is a source electrode are coupled at the conductive layer 77. The conductive layer 77 penetrates through the insulating layer 42, the gate insulating film 40, the insulating layer 46, the mask insulating film 44, and the semiconductor layer 20 along the Z direction.

In addition, the semiconductor device 11 according to the second embodiment includes a conductive layer 75 coupled to the gate electrode 50 from the rearward in the Z direction. The conductive layer 75 penetrates along the Z direction through the gate insulating film 40 and the insulating layer 46 stacked at the gate electrode 50 in a region where the plurality of column portions 22 are not formed at the X-Y plane.

The basic operation of the semiconductor device 11 described above is similar to that of the semiconductor device 10 according to the first embodiment. However, in a case of the semiconductor device 11, the semiconductor layer 70 is disposed between semiconductor layers 21A at the X-Y plane as described to form the SJ structure. In the semiconductor device 10, the depletion layer expands in the X-Y plane from the interface between the semiconductor layer 21B of the channel formation region R and the semiconductor layer 21A of the drain region D and is formed toward the semiconductor layer 20, and the electric field intensity is the highest locally at the interface between the semiconductor layers 21B and 21A. On the other hand, in the semiconductor device 11, a depletion layer Em is split from the interface between the semiconductor layers 21B and 21A into both sides of the semiconductor layer 70 made of $p^+$-GaN and is formed toward the semiconductor layer 20. Thus, in the semiconductor device 11, the interface having a large difference in impurity concentration expands further than the semiconductor device 10. This makes the electric field intensity lower than the maximum value of the electric field intensity of the semiconductor device 10, and makes the electric field intensity substantially constant from the interface between the semiconductor layers 21B and 21A to the interface between the semiconductor layers 21A and 20. Generally, in order to prevent break down from occurring in the semiconductor device, the withstand voltage is set so as not to exceed the maximum value of the electric field intensity determined on the basis of a material of a semiconductor. Furthermore, when the horizontal axis is the position in the Z direction and the vertical direction is the electric field intensity, the withstand voltage of the semiconductor device is determined on the basis of the area of the distribution of the electric field intensity. In a case of the semiconductor device 11, it is possible to reduce the maximum value of the electric field intensity with the area of the distribution of the electric field intensity being substantially equal to that of the semiconductor device 10. In the semiconductor device 11, as the maximum value of the electric field intensity reduces, it is possible to increase the density of carrier, which makes it possible to reduce the on-resistance.

Method of Manufacturing Semiconductor Device

Next, a method of manufacturing the semiconductor device 11 according to the second embodiment will be described. FIGS. 16 to 20 are cross-sectional views each illustrating one step of the method of manufacturing the semiconductor device 11.

First, each of the steps of the method of manufacturing the semiconductor device 10 according to the first embodiment that has been described with reference to FIGS. 3 to 9 is similarly performed. After this, for example, lithography and an etching method are used to form a through hole 54 in the gate electrode 50 in a region of where the plurality of column portions 22 are not formed in the X-Y plane. The through hole 54 penetrates through only the gate electrode 50 in the Z direction, and causes a front surface of the gate insulating film 40, that is, the bottom surface 40b to be exposed.

Figure 16:
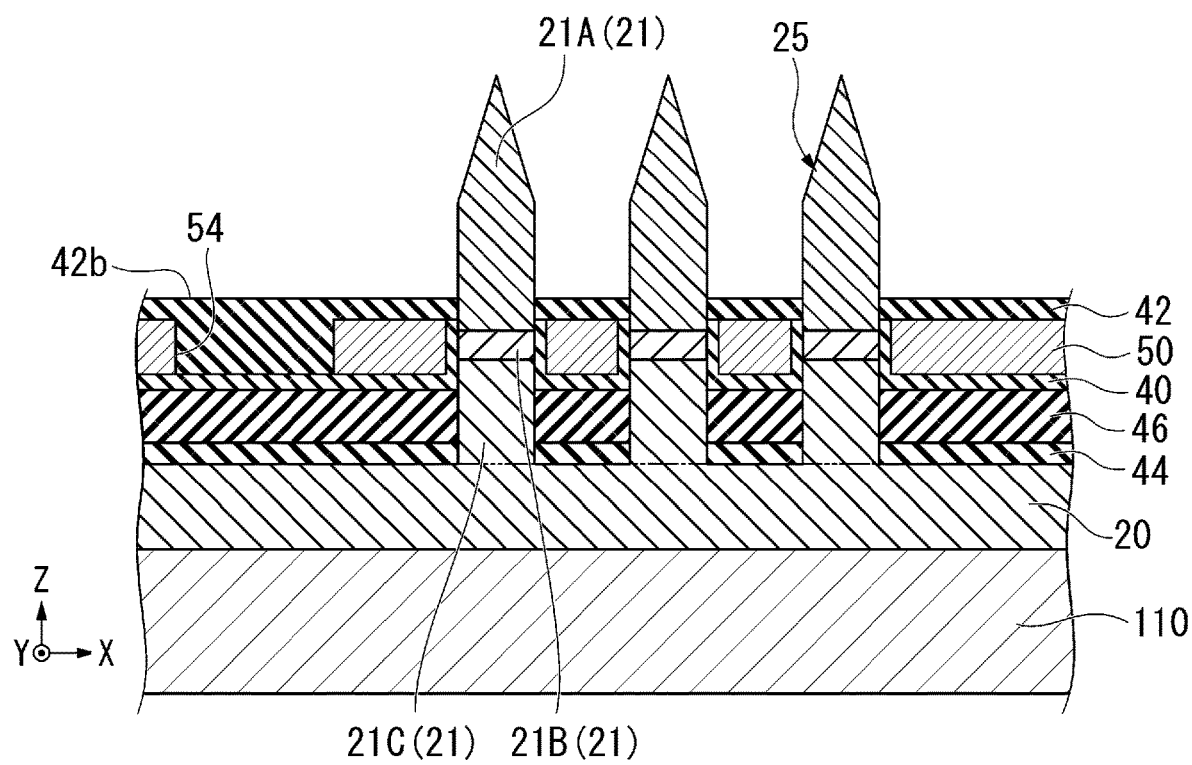
FIG. 16 is a cross-sectional view used to explain a method of manufacturing the semiconductor device illustrated in FIG. 15.

Next, although no illustration is given, the through hole 54 is filled, and a SOG solution is applied and processing is performed so as to cover an exposed columnar body 25 protruding in the Z direction from the front surface of the gate electrode 50, to form the insulating layer 42. Then, etching back is performed to the insulating layer 42 until the front surface, which is eventually to be the bottom surface 42b, of the insulating layer 42 sits at an appropriately more rear side in the Z direction than the front surface, which is eventually to be the bottom surface 50b, of the gate electrode 50, that is, sits at a position appropriately higher than the gate electrode 50, as illustrated in FIG. 16. At this time, the bottom surface 42b of the insulating layer 42 is flattened to be a flat surface.

Figure 17:
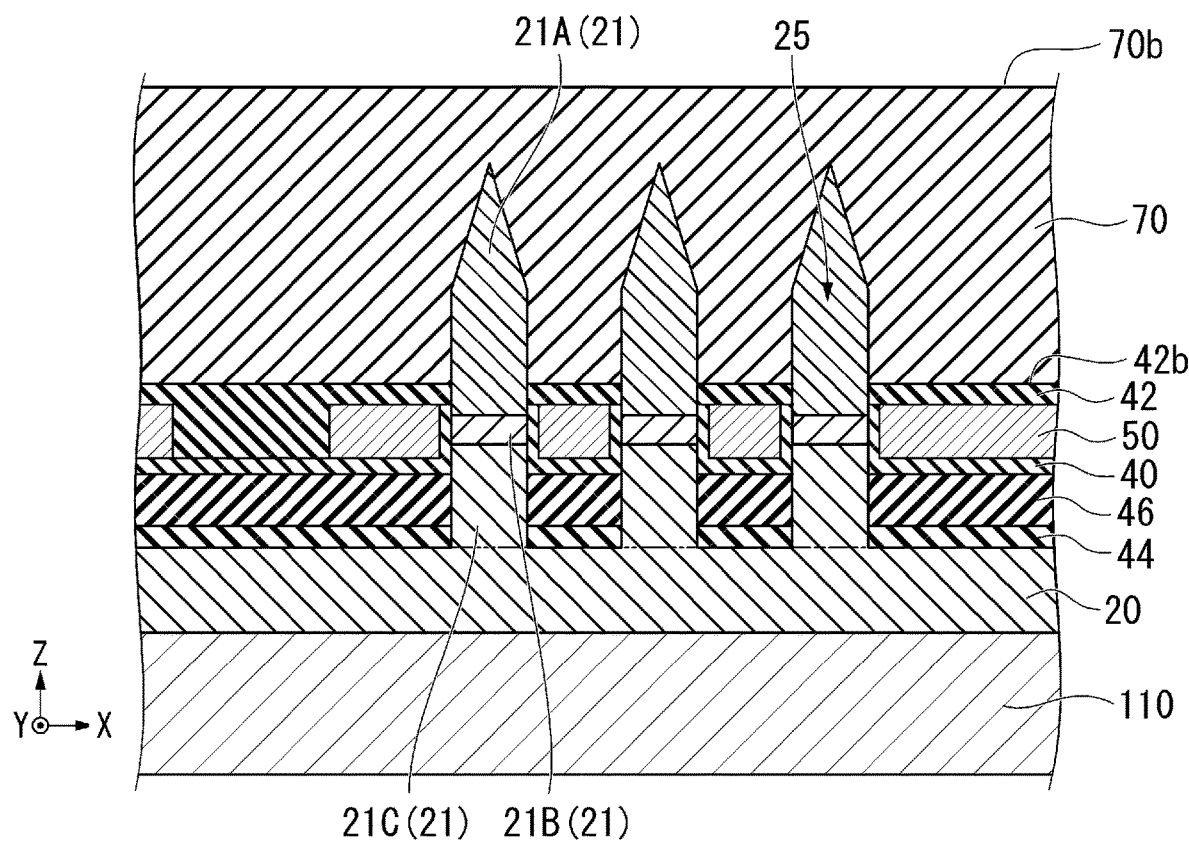
FIG. 17 is a cross-sectional view used to explain a method of manufacturing the semiconductor device illustrated in FIG. 15.

Next, as illustrated in FIG. 17, a metal organic CVD (MOCVD) method is used to deposit p$^+$-GaN so as to cover the exposed columnar body 25 protruding in the Z direction from the bottom surface 42b of the insulating layer 42, to form the semiconductor layer 70.

Figure 18:
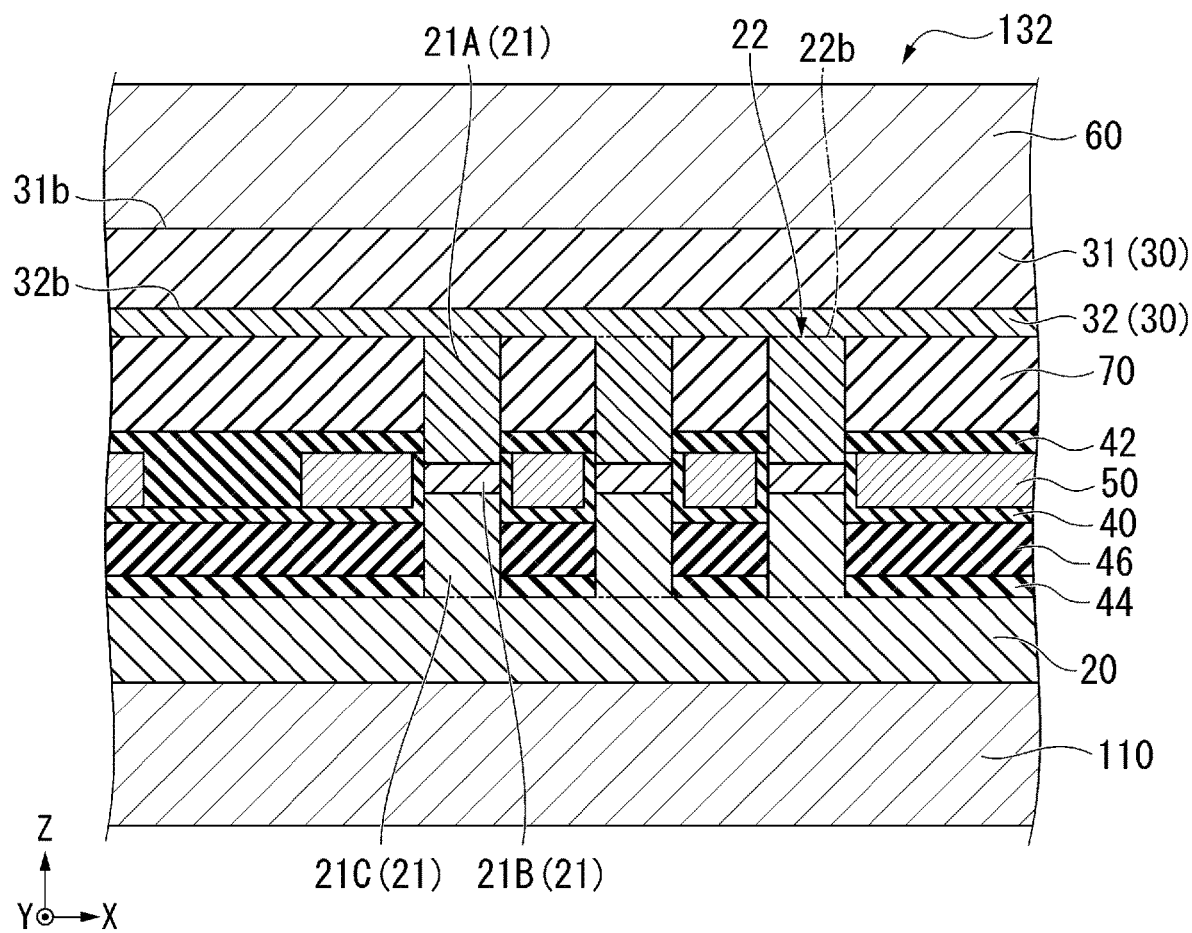
FIG. 18 is a cross-sectional view used to explain a method of manufacturing the semiconductor device illustrated in FIG. 15.

Next, for example, a thermal etching method using phosphoric acid or the like is used to remove the front portion of the semiconductor layer 70 in the Z direction. As illustrated in FIG. 18, the front surface, which is eventually to be the bottom surface 70b, of the semiconductor layer 70 is configured such that the front surface, which is eventually to be the bottom surface 70b, of the semiconductor layer 70 sits at the most rear side in the Z direction of the front surface of the semiconductor layer 21A having concave and convex portions and also sits at an appropriately more front side in the Z direction than the semiconductor layer 21B, that is, sits at a position higher than the semiconductor layer 21B. The bottom surface 70b of the semiconductor layer 70 is aligned with the bottom surface 22b of each of the plurality of column portions 22 in the Z direction, and is flush with the bottom surface 22b.

Next, for example, by using the MBE, crystal of n$^-$-GaN is caused to grow to have a predetermined height in the Z direction over the entire flat surface comprised of the bottom surface 22b of each of the plurality of column portions 22 and the bottom surface 70b of the semiconductor layer 70, to form the second layer 32 of the semiconductor layer 30. Then, for example, by using the MBE, crystal of n$^+$-GaN is caused to grow to have a predetermined height in the Z direction at the front surface, which is eventually to be the bottom surface 32b, of the second layer 32, to form the first layer 31 of the semiconductor layer 30. Next, a gluing metal layer, which is not illustrated, is deposited at a front surface, which is eventually to be the bottom surface 31b, of the first layer 31 of the semiconductor layer 30, and in addition, the metal layer 60 is glued.

Figure 19:
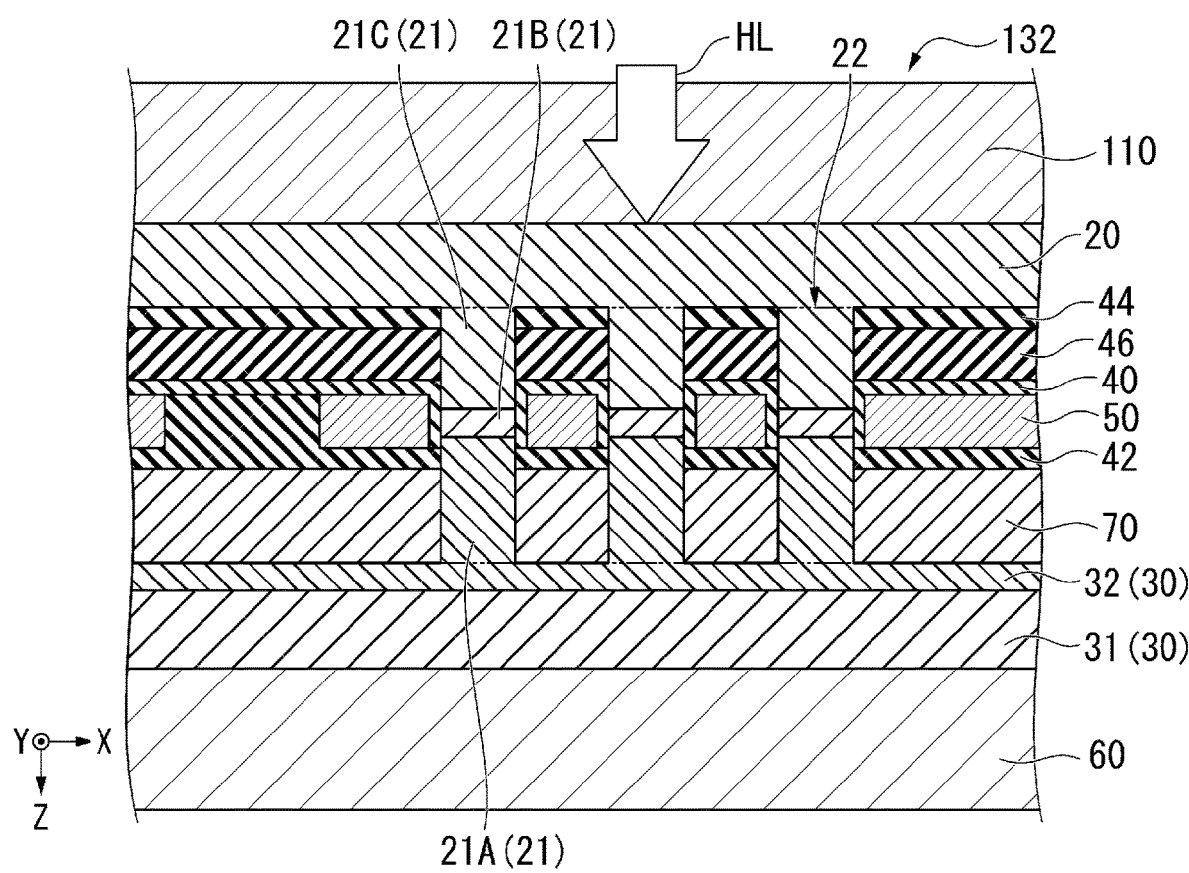
FIG. 19 is a cross-sectional view used to explain a method of manufacturing the semiconductor device illustrated in FIG. 15.

Next, as in the method of manufacturing the semiconductor device 10 according to the first embodiment, the substrate 110 is removed from a stacked structural body 132 made of the substrate 110, the semiconductor layers 20, 21C, 21B, 21A, the mask insulating film 44, the insulating layer 46, the gate insulating film 40, the gate electrode 50, the insulating layer 42, the semiconductor layers 70 and 30, and the metal layer 60, each of which has been manufactured on and before the previous steps. Specifically, as illustrated in FIG. 19, the stacked structural body 132 is inverted in the Z direction, and for example, an LLO process is performed. In the LLO process, a high-power laser light source, which is not illustrated, emits laser light HL from behind the substrate 110 in the Z direction to peel the substrate 110 from the semiconductor layer 20.

Figure 20:
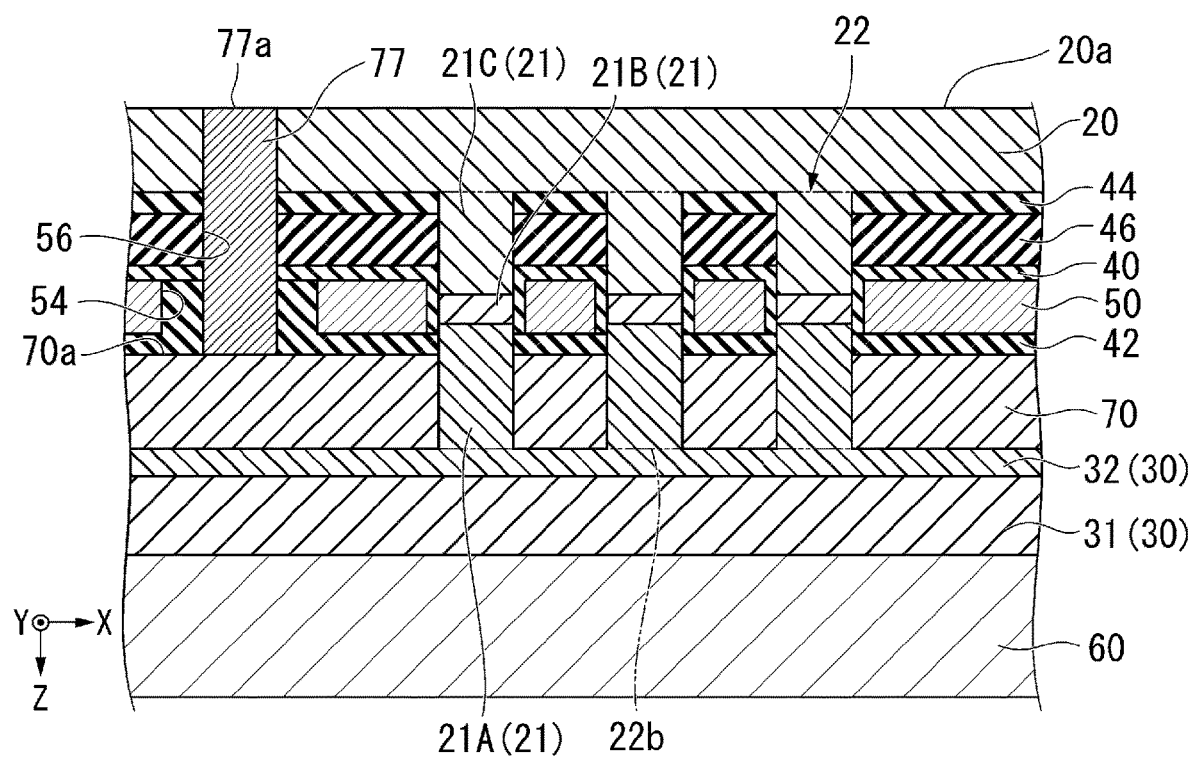
FIG. 20 is a cross-sectional view used to explain a method of manufacturing the semiconductor device illustrated in FIG. 15.

Next, in a region included in the through hole 54 in the X-Y plane, a through hole 56 that reaches the front surface 70a of the semiconductor layer 70 in the Z direction is formed from the front surface 20a of the semiconductor layer 20 that is exposed after the substrate 110 is peeled off, as illustrated in FIG. 20. The through hole 56 can be formed, for example, using a dry etching method. Then, by using, for example, the CVD method, W is deposited in the through hole 56 and also in the Z direction from the through hole 56 to form the conductive layer 77. After this, etching back is performed to the conductive layer 77 until the front surface of the conductive layer 77 and the front surface 20a of the semiconductor layer 20 are flush with each other.

Although no illustration is given, in a region other than the region where the plurality of column portions 22 are formed within the X-Y plane, a dry etching method is used to remove an interlayer insulating layer disposed more toward the Z direction than the gate electrode 50, for example, in a region where the conductive layer 75 that is in contact with the gate electrode 50 is disposed, to form a contact hole. Then, for example, a CVD method is used to deposit W within the contact hole and a portion located more toward the Z direction than the contact hole to form the conductive layer 75.

Next, an adhesive is applied to the front surface 20a of the semiconductor layer 20 and the front surface 77a of the conductive layer 77 in a region where the plurality of column portions 22 are formed in the X-Y plane to glue the metal layer 12.

By performing the processes described above, the main structure of the semiconductor device 11 illustrated in FIG. 15 is manufactured. Although illustration is not given, post processes are performed as necessary to complete the semiconductor device 11.

Operation Effect

The semiconductor device 11 according to the second embodiment described above has the configuration similar to that of the semiconductor device 10 according to the first embodiment, and hence, has operation and effect similar to that of the semiconductor device 10. With the semiconductor device 11 according to the second embodiment, it is possible to suppress an increase in the contact resistance at coupling of each of the metal layers 12 and 60 and the plurality of column portions 22 each having a small diameter in the X-Y plane, prevent a deterioration in the performance, and favorably perform operation.

In the semiconductor device 11 according to the second embodiment, the semiconductor layer 30 that constitutes the drain region D includes the first layer 31 and the second layer 32 provided between the first layer 31 and each of the plurality of column portions 22 in the Z direction. The impurity concentration of the second layer 32 is lower than the impurity concentration of the first layer 31. With this configuration, even when, in place of the insulating layer 42, the semiconductor layer 70 made of p$^+$-GaN is provided so as to be adjacent to the semiconductor layer 21A made of n$^-$-GaN in the X-Y plane and the semiconductor device 11 has a SJ structure, it is possible to prevent occurrence of break down at the FET of the semiconductor device 11 including the plurality of column portions 22 and the SJ structure.

In the semiconductor device 11 according to the second embodiment, the plurality of column portions 22 each have a small diameter in the X-Y plane, and have a fine structure, as with the semiconductor device 10 according to the first embodiment. Thus, it is possible to configure the plurality of column portions 22 to be independent of each other, and also easily configure the SJ structure using $p^+$-GaN as described above.

These are detailed description of preferred embodiments according to the present disclosure. However, the present disclosure should not be limited to these particular embodiments, and can be modified or changed in a various manner within the scope of the main point of the present disclosure described in CLAIMS. Furthermore, the constituent elements of a plurality of embodiments can be combined on an as-necessary basis.

For example, in the semiconductor device according to the present disclosure, the first semiconductor layer extending in the X-Y plane may be coupled only to the source region S of each of the plurality of column portions 22, depending on the configuration of the column portion 22 or arrangement of independent constituent elements of a transistor. In other words, the first semiconductor layer is coupled to at least one of the source region S and the drain region D of each of the plurality of column portions 22.

Furthermore, the semiconductor device according to the present disclosure can be applied to a power device such as an inverter as described in each of the embodiments described above. However, the application of the semiconductor device according to the present disclosure is not limited to the power device. For example, the semiconductor device according to the present disclosure may be mounted on a vehicle such as automobile or a mobile body such as an airplane, and can be applied to various types of semiconductor devices or switching devices. In the semiconductor device according to the present disclosure, the material of each of the constituent elements can be changed in accordance with application of the semiconductor device as long as it does not interfere with the operation of the plurality of column portions 22 as an FET.

For example, in the semiconductor device according to the present disclosure, the semiconductor that constitutes the source region S, the drain region D, and the channel formation region R of each of the plurality of column portions is not limited to n-GaN nor GaN. The semiconductor of the column portion may be made of Si, gallium arsenide (GaAs), silicon carbide (SiC), or the like if these are permitted in the applications of the semiconductor device according to the present disclosure. Note that it is preferable that the semiconductor of the column portion exhibits an electrical characteristic suitable for each region in the FET by changing the impurity concentration.

For example, when the semiconductor device according to the present disclosure is used in a power device such as an inverter, it is preferable that the gate electrode is made of Poly-Si doped with Br in relation to the fact that the semiconductor that constitute each of the plurality of column portions is made of n-GaN. However, the gate electrode may be made, for example, of Al or W or an electrically conductive material including these metals, when the semiconductor that constitutes an FET of the semiconductor device according to the present disclosure is made of SiC and the application of the semiconductor device permits it.

The semiconductor device according to an aspect of the present disclosure may have the following configuration.

The semiconductor device according to an aspect of the present disclosure includes the plurality of column portions made of the semiconductor. The plurality of column portions each include the source region, the drain region, and the channel formation region including a channel formed between the source region and the drain region. The semiconductor device according to an aspect of the present disclosure further includes the gate electrode provided at the side wall of the channel formation region with the insulating layer being formed therebetween, the first semiconductor layer coupled to either one of the source region and the drain region of each of the plurality of column portions, and the first metal layer coupled to the first semiconductor layer.

The semiconductor device according to one aspect of the present disclosure may include a second semiconductor layer coupled to the other one of the source region and the drain region of each of the plurality of column portions, and a second metal layer coupled to the second semiconductor layer.

In the semiconductor device according to one aspect of the present disclosure, the impurity concentration of the first semiconductor layer may be higher than the impurity concentration of the semiconductor of the channel formation region.

In the semiconductor device according to one aspect of the present disclosure, the gate electrode may be made of polycrystalline silicon. In the semiconductor device according to one aspect of the present disclosure, the gate electrode may be doped with boron.

In the semiconductor device according to one aspect of the present disclosure, the semiconductor of the source region and the semiconductor of the drain region may be n-type semiconductors.

In the semiconductor device according to one aspect of the present disclosure, the first semiconductor layer may include the first layer, and the second layer provided between the first layer and each of the plurality of column portions. In this case, the impurity concentration of the second layer is lower than the impurity concentration of the first layer.

What is claimed is:

1. A semiconductor device comprising:
    a plurality of column portions including a semiconductor, the plurality of column portions each including:
    a source region;
    a drain region; and
    a channel formation region located between the source region and the drain region,
    the semiconductor device further comprising:
    a gate electrode provided, via an insulating layer, at a side wall of the channel formation region of each of the plurality of column portions and configured to control a current between the source region and the drain region;
    a first semiconductor layer coupled to the source region of each of the plurality of column portions;
    a first metal layer coupled to the first semiconductor layer;
    a second semiconductor layer coupled to the drain region of each of the plurality of column portions; and
    a second metal layer coupled to the second semiconductor layer, wherein
    a thickness of the drain region is greater than a thickness of the source region, and an impurity concentration of the semiconductor included in the drain region is lower than an impurity concentration of the semiconductor included in the source region.

2. The semiconductor device according to claim 1, wherein
an impurity concentration of the first semiconductor layer is higher than an impurity concentration of the semiconductor included in the channel formation region.

3. The semiconductor device according to claim 1, wherein
the gate electrode includes polycrystalline silicon.

4. The semiconductor device according to claim 3, wherein
the gate electrode is doped with boron.

5. The semiconductor device according to claim 1, wherein
the semiconductor included in the source region and the drain region is an n-type semiconductor.

6. The semiconductor device according to claim 1, wherein
the first semiconductor layer includes:
a first layer; and
a second layer provided between the first layer and each of the plurality of column portions, and
an impurity concentration of the second layer is lower than an impurity concentration of the first layer.

\* \* \* \* \*